(12) United States Patent
Akamatsu et al.

(10) Patent No.: US 7,293,692 B2
(45) Date of Patent: Nov. 13, 2007

(54) SOLDER JOINT STRUCTURE, SOLDERING METHOD, AND ELECTRONIC-COMPONENT MANUFACTURING APPARATUS USING THE SAME STRUCTURE AND THE METHOD

(75) Inventors: Hiroshi Akamatsu, Ichinomiya (JP); Yukinori Kawamura, Gifu (JP); Hiroshi Kai, Aichi (JP); Osamu Kuramoto, Bisai (JP); Shigeru Iwasaki, Gifu (JP); Kenji Asai, Nishikasugai (JP); Minoru Hibino, Mizuho (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 347 days.

(21) Appl. No.: 10/865,474

(22) Filed: Jun. 10, 2004

(65) Prior Publication Data

US 2004/0253474 A1 Dec. 16, 2004

(30) Foreign Application Priority Data

Jun. 13, 2003 (JP) ............................. 2003-169077

(51) Int. Cl.
*B23K 31/02* (2006.01)
(52) U.S. Cl. .............................. 228/248.1; 228/233.2; 228/43
(58) Field of Classification Search ............. 228/248.1, 228/233.2, 43
See application file for complete search history.

(56) References Cited

U.S. PATENT DOCUMENTS 5,867,898 A * 2/1999 Lauffer et al. ................. 29/840
6,929,169 B2 8/2005 Kubokawa et al.
2002/0074164 A1 6/2002 Ishizuka et al.
2003/0200836 A1* 10/2003 Amita et al. ................... 75/255
2003/0201310 A1* 10/2003 Nakatsuka et al. .......... 228/207
2004/0050915 A1* 3/2004 Goenka et al. ........... 228/248.1
2005/0067189 A1* 3/2005 Tanabe et al. .............. 174/260
2006/0145352 A1* 7/2006 Soga et al. .................. 257/772
2006/0151889 A1* 7/2006 Kajiwara et al. ........... 257/787

FOREIGN PATENT DOCUMENTS

| EP | 1 195 217 | 4/2002 |
|---|---|---|
| JP | 01066949 | 3/1989 |
| JP | 09-174278 | 7/1997 |

OTHER PUBLICATIONS

European Search Report corresponding to Application No. PCT/JP03/169077 dated Feb. 22, 2006.

* cited by examiner

*Primary Examiner*—Len Tran
(74) *Attorney, Agent, or Firm*—RatnerPrestia

(57) ABSTRACT

A structure of solder joint structure formed of zinc-based lead-free solder having excellent characteristics is disclosed. Between a first lead-free solder layer and a soldering pad, the following layers are formed: a tin-copper alloy layer formed on the pad; a first alloy layer formed of second lead-free layer of which main ingredients are tin and silver; and a second alloy layer formed between the first alloy layer and the first lead-free solder. This structure allows forming the solder joint structure formed of zinc-based lead-free solder having high joint strength.

29 Claims, 19 Drawing Sheets

Fig. 1 3
(a)
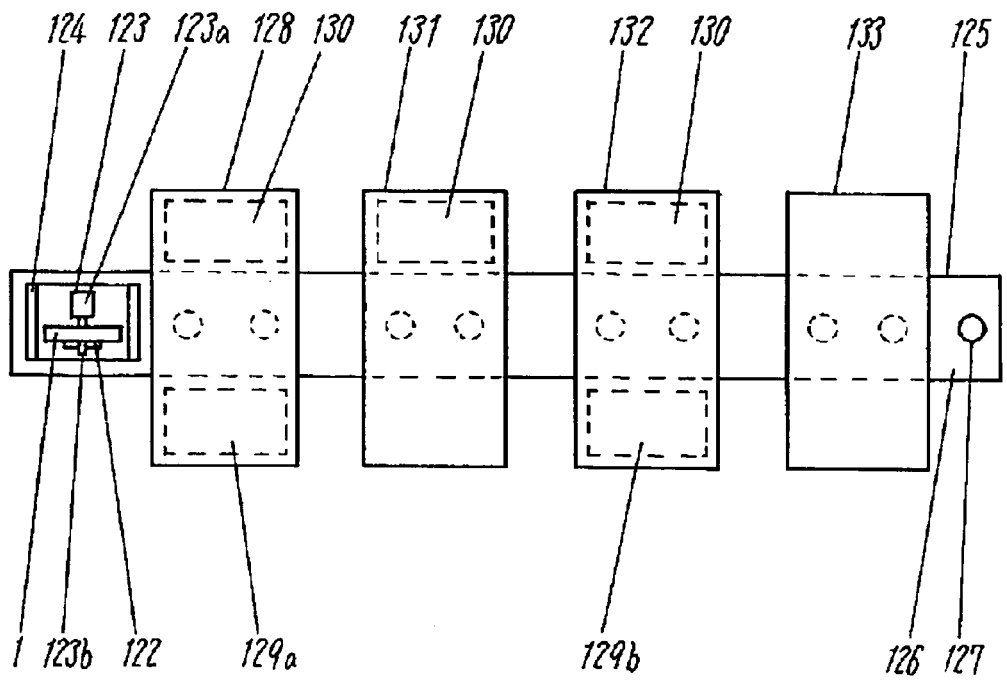
(b)
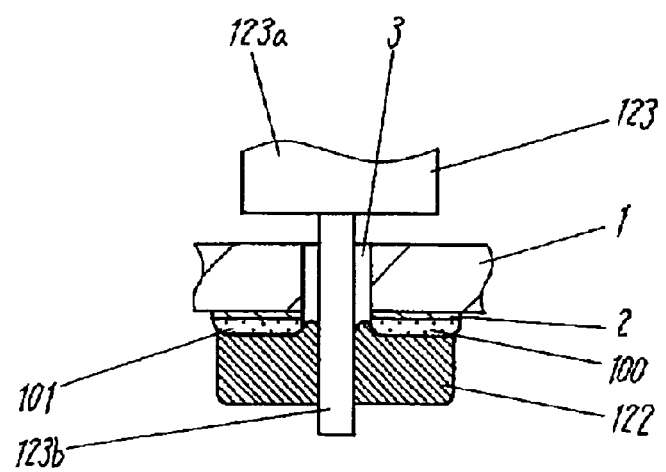

Fig. 16
(a)
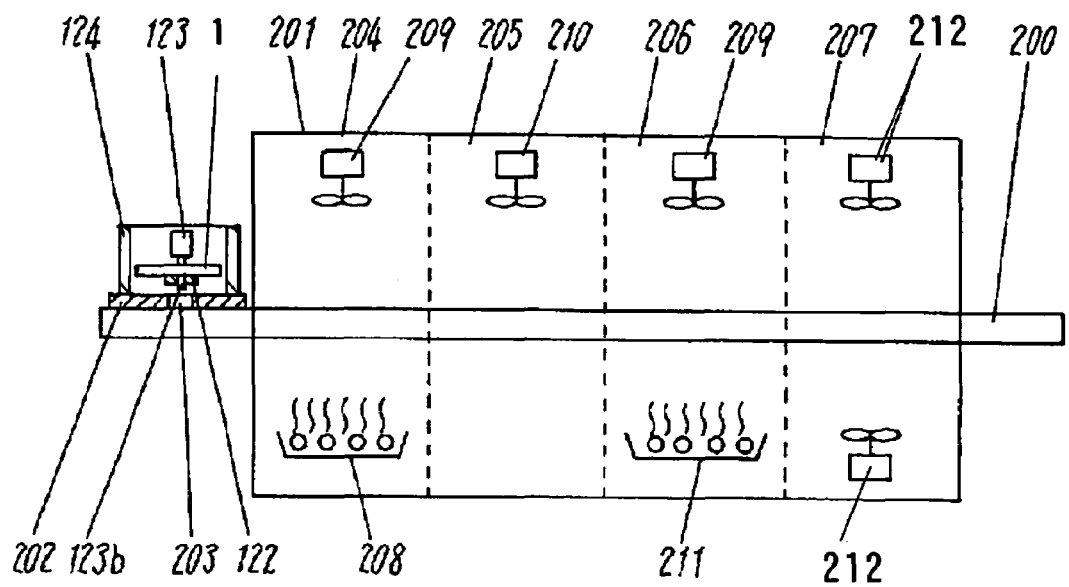
(b)
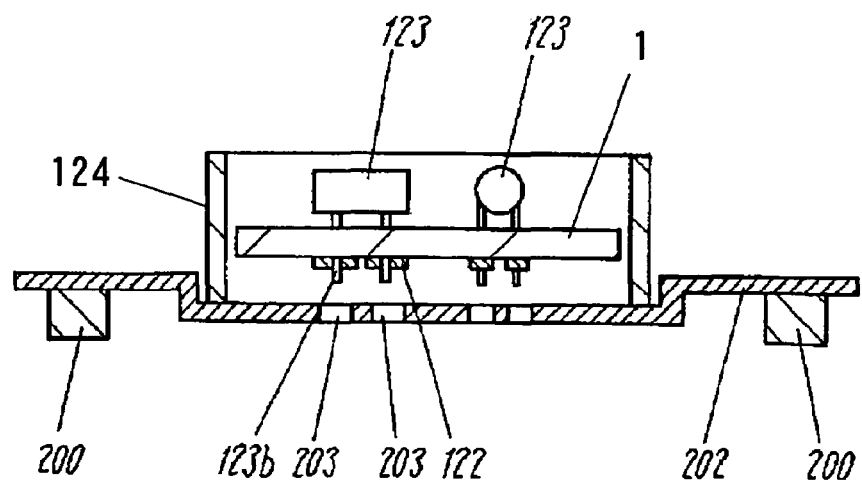

SOLDER JOINT STRUCTURE, SOLDERING METHOD, AND ELECTRONIC-COMPONENT MANUFACTURING APPARATUS USING THE SAME STRUCTURE AND THE METHOD

FIELD OF THE INVENTION

The present invention relates to a solder joint structure, a method of joint by soldering, and a soldering apparatus. More particularly, it relates to the solder joint structure by which electronic components are soldered, and which structure comprises lead-free solder including tin and zinc, the method of soldering, and a manufacturing apparatus of electronic components, which apparatus uses the same solder joint structure and the same method.

BACKGROUND OF THE INVENTION

Lead-free solder has been growingly demanded these days from the viewpoint of environmental protection, because lead (Pb) is possibly harmful to humans. The lead-free solder, however, has generally a higher melting point than that of tin- and lead-based conventional solder. Thus the technique about solder joint structure using zinc-based lead-free solder has been developed because a melting point of the zinc-based lead-free solder can be approximated to that of tin- and lead-based solder.

First, a solder-joint technique using conventional zinc-based lead-free solder is described with reference to FIGS. 17-19 (e.g. refer to Japanese Patented Publishing No. JP9-174278). FIG. 17 shows a sectional view of a conventional solder joint structure. In FIG. 17, printed circuit board (PCB) 1 has soldering pad 2 (pad) formed of copper foil etched at a predetermined place thereon. Hole 3 extending through both PCB 1 and pad 2 is formed at a substantial center of pad 2. For instance, lead 5 of component 4, such as an electrolytic capacitor, extends through hole 3. Lead 5 is connected to pad 2 with a layer formed of lead-free and tin-, silver-, copper-based solder 6 as well as another layer formed of tin-, zing-based lead-free solder 7.

Next, steps of a conventional soldering are described hereinafter. FIG. 18 shows a flowchart illustrating steps of forming a conventional solder joint structure. FIG. 19 shows a schematic and enlarged sectional view of an essential part of the conventional solder joint structure. In FIG. 18, application step S10 starts the soldering operation by applying paste or cream of tin-, silver- and copper-based lead-free solder to PCB 1. In this application step S10, tin-, silver- and copper-based lead-free solder is printed on PCB 1 using a screen mask having 120 μm thickness.

Next, first reflow step S11 follows step S10. In step S11, lead-free solder applied to PCB 1 in step 10 is heated and melted to form solder layer 6, and as shown in FIG. 19, tin-copper alloy layer 21 of approx. 3 mm thick made from $Cu_3Sn$ alloy and $Cu_6Sn_5$ alloy is formed between pad 2 and solder layer 6. Then application step S12 follows, where paste of tin- and zinc-based lead-free solder is applied onto solder layer 6. In step S12, the paste of zinc-based lead-free solder is printed on PCB 1 by metal plate of 1.2 mm thick.

Then component insertion step S13 follows, where lead 5 of component 4 is inserted into hole 3 of PCB 1 where the paste of zinc-based lead-free solder is printed. Second reflow step S14 then follows, where the tin-, zinc-based lead-free solder is melted to form tin-, zinc-based solder layer 7, thereby component 4 is soldered to PCB 1 at its lead 5.

A temperature in second reflow step S14 should be set as low as possible so that the temperature of component 4 cannot exceed its compensation temperature during step S14. In second reflow step S14, the component is thus soldered at the lowest possible temperature for melting tin-, zinc-based lead-free solder, so that the temperature of tin-, zinc-based lead-free solder has never exceeded the liquidus temperature in step S14.

Because of what is discussed above, upon formation of tin-, zinc-based lead-free solder layer 7, it is considered that tin-zinc alloy layer 22 as shown in FIG. 19 is formed between tin-copper alloy layer 21 and lead-free solder layer 6 formed in first reflow step S11. Actually, the presence of layer 22 is confirmed. In such a conventional solder joint structure, the zinc in solder layer 7 and the copper in pad 2 diffuse and enter into solder layer 6, thereby forming copper-zinc alloy layer 22 on top of tin-copper alloy layer 21. If this state undergoes a high temperature environment, zinc and copper diffusing in layer 6 are further consumed, so that alloy layer 22 grows gradually for hours. The schematic sectional view shown in FIG. 19 shows boundaries explicitly between respective layers; however, those boundaries are prepared for simplifying the description. Actually, each component ratio varies time-dependently and such explicit boundaries do not exist. In this description, however, the boundaries are shown in order to illustrate ranges recognizable with SEM pictures as the layers.

Growth of tin-zinc alloy layer 22 weakens the strength of joint structure, so that the reliability of the soldering lowers, and this is the problem to be solved of the conventional soldering.

The present invention addresses the foregoing problem, and aims to provide a solder-joint technique using zinc-based lead-free solder which resists lowering the joint strength of soldering.

SUMMARY OF THE INVENTION

To achieve the foregoing objective, a solder joint structure of the present invention comprises the following elements:
  a first lead-free solder layer;
  a soldering pad;
  a first alloy layer formed of a tin-copper alloy layer and a second lead-free solder layer, the first alloy layer being disposed between the first lead-free solder layer and the soldering pad; and
  a second alloy layer disposed between the first alloy layer and the first lead-free solder layer.

The foregoing structure achieves a solder joint structure free from lowering the joint strength, and formed of zinc-based lead-free solder.

To be more specific, the solder joint structure couples a lead of an electronic component to the soldering pad formed of copper foil and prepared at a given place on an insulated substrate with the first lead-free solder. This solder joint structure comprises the following elements:
  the pad having the first alloy layer made of the second lead-free solder layer thereon, the second lead-free solder layer being connected to the tin-copper alloy layer; and
  the second alloy layer formed between the first alloy layer and the first lead-free solder layer.

In this structure, the first lead-free solder can be mainly made of tin and zinc.

The structure discussed above thus includes the first and the second alloy layers, so that zinc hardly enters into the copper foil passing through those barrier layers. This structure thus can suppress the growth of copper-zinc alloy between the copper-tin alloy layer and the tin-, silver-, copper-based lead-free solder in a high temperature environment. The solder joint structure formed of zinc-based lead-free solder and free from lowering the joint strength is thus obtainable. This solder joint structure can suppress also voids, so that cracks due to thermal shocks scarcely occurs.

A solder joint structure of the present invention includes a tin-copper alloy layer being formed by melting a second lead-free solder layer prepared on the pad in advance. Here is another structure: copper in the tin-copper alloy layer diffuses into the first alloy layer, thereby consuming copper molecules around the boundary of the second alloy layer to form the second alloy layer.

Those structures allows consuming the copper molecules around the boundary between the first alloy layer and the tin-, zinc-based lead-free solder, so that the second alloy layer is formed. Since the copper molecule around the boundary is consumed, the copper-zinc alloy layer hardly grows any more. In other word, the formation of the second alloy layer suppresses the diffusion of zinc of the first lead-free solder into the first alloy layer. Thus the zinc-copper alloy is suppressed to grow in a high temperature environment. As a result, the solder joint structure formed of zinc-based lead-free solder and free from lowering the joint strength is thus obtainable. This solder joint structure can suppress also voids, so that cracks due to thermal shocks scarcely occurs.

A solder joint structure of the present invention includes a first lead-free solder and a second lead-free solder, and the melting points of both of the lead-free solders are typically the same. Because of typically the same melting point, the first lead-free solder and the second lead-free solder are melted together. At the melting, zinc in the first lead-free solder is bound to copper molecules diffusing in the first alloy layer, thereby forming a second alloy layer of copper-zinc between the first lead-free solder and the first alloy layer. This is because that the copper molecules diffusing in the first alloy layer are consumed, so that the copper density in the first alloy layer lowers to discontinue supplying the copper. The copper-zinc layer is thus suppressed to grow further. In other words, the formation of the second alloy layer restrains the zinc of the first lead-free solder from diffusing into the first alloy layer. The copper-zinc alloy is thus suppressed to grow in a high temperature environment, and the solder joint structure formed of zinc-based lead-free solder and free from lowering the joint strength is obtainable.

A solder joint structure of the present invention has a second lead-free solder including tin and indium. This structure allows soldering at a low temperature, so that this joint structure is useful for soldering a heat-fragile component. This structure also approximates the melting point of a first lead-free solder, i.e. tin-, zinc-based lead-free solder, to that of the second lead-free solder. Both of these lead-free solders can be thus melted at a low temperature, so that a second alloy layer is obtainable at a low temperature. Therefore, a heat-fragile electronic component can be soldered free from being damaged by heat. The second alloy layer suppresses the copper-zinc alloy to grow in a high temperature environment, and the solder joint structure formed of zinc-based lead-free solder and free from lowering the joint strength is obtainable.

A solder joint structure of the present invention has a second alloy layer that is formed by melting a first alloy layer together with a fist lead-free solder layer. The second alloy layer can include copper and zinc.

This structure allows melting the first lead-free solder together with the second lead-free layer. In this melting status, the zinc in the first lead-free solder and the copper diffusing into the first alloy layer are both activated, and tend to bind to each other. This status invites quickly the binding of the copper in the first alloy layer, where the first and the second lead-free solders are melted, to the zinc in the first lead-free solder. The second alloy layer of copper-zinc is thus formed between the first lead-free solder and the first alloy layer. Since the copper molecules diffusing in the first alloy layer are consumed, the copper-zinc alloy layer hardly grows any more. In other words, the formation of the second alloy layer suppresses the diffusion of zinc in the first lead-free solder into the first alloy layer. Thus the zinc-copper alloy is suppressed to grow in a high temperature environment. As a result, the solder joint structure formed of zinc-based lead-free solder and free from lowering the joint strength is obtainable. This solder joint can suppress also voids, so that cracks due to thermal shocks scarcely occurs.

A solder joint structure of the present invention has a thickness of a first alloy layer greater than a diffusing distance of zinc molecules in the first lead-free solder layer when the first lead-free solder layer is melted. Even if the zinc passes through the second alloy layer and enters into the first alloy layer, this structure reduces an amount of zinc to reach the surface of the copper foil. The production of copper-zinc alloy in a high temperature environment can be thus reduced. As a result, the solder joint formed of zinc-based lead-free solder and free from lowering the joint strength is obtainable.

A method of soldering a lead of an electronic component to a soldering pad formed of copper foil at a given place on an insulated substrate with first lead-free solder is disclosed in the present invention. To be more specific, the method comprises the following steps:

first step: apply paste, ink or cream of a second lead-free solder on the pad, then mount a first electronic component at a given place of the pad, and heat to melt the second lead-free solder;

second step: apply paste, ink or cream of a first lead-free solder to the component-free area of the pad;

third step: mount a second electronic component to the pad at the place where first lead-free solder is applied; and fourth step: heat to melt the first lead-free solder.

In addition to the method discussed above, at least one of the following structures can be used:

the first lead-free solder has typically the same melting point as the second lead-free solder;

the first lead-free solder is made of mainly tin and zinc; or in the first step, heat to melt the second lead-free solder, thereby forming a first alloy layer on the pad, which layer includes the second lead-free solder layer connected to a tin-copper alloy layer.

Those structures allows the first step to form an alloy layer including a first alloy layer of tin-copper and the second lead-free solder. A second alloy layer is further formed between the second lead-free solder and the first lead-free solder, so that the first alloy layer and the second alloy layer are formed. Those alloy layers prevent the zinc included in the first lead-free solder from reaching the pad, thereby suppressing the production and growth of copper-zinc alloy in a high temperature environment. As a result, the solder joint structure formed of zinc-based lead-free solder and free from lowering the joint strength is obtainable. In the first step, upon the formation of the first alloy layer on the pad, components can be mounted.

The soldering method of the present invention applies the second lead-free solder onto the pad by the screen printing method. The screen to be used has an opening facing the pad and a shield, which is disposed toward a hole prepared at a substantial center of the pad, for covering the hole.

Those structures discussed above allow forming the tin-copper alloy layer and the tin layer with ease. Since the solder is not supplied to the hole, the hole does not clog with the solder. A means for forming the first alloy layer prints the second lead-free solder on the pad by the screen printing method, and heats the solder printed using a heating means, thereby obtaining the first alloy layer. The first alloy layer is thus obtainable very simply. An appropriate selection of the screen thickness will change the thickness of the first alloy layer with ease.

According to the soldering method of the present invention, the opening of the screen has a coupler coupled to the shield. The second lead-free solder is not applied to the entire coupler, thus the width of the coupler's section where the second lead-free solder is not applied is set as follows: When the second lead-free solder is heated, the applied second lead-free solder runs, and this run at a place facing the section can cover the section.

The foregoing structure allows the second lead-free solder to cover substantially the entire pad, so that the pad does not expose itself. As a result, the zinc from of the tin-, zinc-based lead-free solder supplied over the pad and the copper from the pad produce only a little alloy. Therefore, in a high temperature environment, the copper-zinc alloy is hardly produced between the first alloy layer (tin-copper) and the second lead-free solder, and even if it is produced, it grows little. As a result, the solder joint structure formed of zinc-based lead-free solder and free from lowering the joint strength is obtainable. Since the pad does not expose itself, the solderability of the zinc-based lead-free solder improves.

In the fourth step of the soldering method of the present invention, when the first and the second lead-free solders are heated together to melt, the second alloy layer is formed between the first alloy layer and the first lead-free solder layer. This second alloy layer is formed of the copper diffusing in the first alloy layer and the zinc included in the first lead-free solder.

The foregoing structure allows the zinc in the first lead-free solder and the copper molecules diffused by the first step into the second lead-free solder to bind together and form the second alloy layer (copper-zinc) between the first and the second lead-free solders. When the second lead-free solder cannot supply the copper any more, the copper-zinc layer scarcely grows further. In other words, the formation of the second alloy layer lowers the copper density in the second lead-free solder, and suppresses further diffusion of zinc from the first lead-free solder into the second lead-free solder. Thus the copper-zinc alloy is suppressed to grow in a high temperature environment. As a result, the solder joint structure formed of zinc-based lead-free solder and free from lowering the joint strength is obtainable.

According to the soldering method of the present invention, the second lead-free solder includes tin and indium. This structure allows soldering at a low temperature, so that this method is useful for soldering heat-fragile components. This structure also approximates the melting point of the first lead-free solder, i.e. tin-, zinc-based lead-free solder to that of the second lead-free solder. Both of the lead-free solders can be thus melted at a low temperature, so that the second alloy layer is obtainable at a low temperature. Therefore, a heat-fragile electronic component can be soldered free from being damaged by heat. Since the first lead-free solder is tin-, indium-based, its melting point is near that of the zinc-based lead-free solder. Thus the heat melting the first lead-free solder can also melt the second lead-free solder, so that both of the solders can be firmly soldered to each other.

According to the soldering method of the present invention, in the fourth step, the first and the second lead-free solders are melted together. This structure allows the zinc in the first lead-free solder and the copper molecules diffusing into the first alloy layer to bind together, and the second alloy layer (copper-zinc) is formed between the first and the second lead-free solders. However, when the copper molecules diffusing into the second lead-free solder is consumed, this copper-zinc layer scarcely grows further. In other words, the formation of the second alloy layer lowers the copper density in the second lead-free solder, and suppresses further diffusion of zinc from the first lead-free solder into the first alloy layer. Thus the copper-zinc alloy is suppressed to grow in a high temperature environment. As a result, the solder joint structure formed of zinc-based lead-free solder and free from lowering the joint strength is obtainable.

The soldering method of the present invention in the case of soldering a heat-fragile component has the following sub-steps in the fourth step:

a preheat step of pre-heating the second lead-free solder up to a given first temperature; then
  a first cooling step of restraining the second lead-free solder from rising in temperature with a first cooling means; then
  a heating step of heating the first and the second lead-free solders to melt up to a second temperature with a heating means; and
  a second cooling step of cooling the first and the second lead-free solders melted by the heating step with a second cooling means.

The foregoing structure allows melting the first and the second lead-free solders together. At this time, the zinc in the first lead-free solder and the copper molecule diffusing in the first alloy layer are bound together, so that the second alloy layer is formed between the first lead-free solder and the first alloy layer. The copper molecules diffusing in the first lead-free solder is consumed due to the formation of the second alloy layer, so that the copper-density of the first alloy layer lowers. The copper-zinc layer scarcely grows further. The formation of the second alloy layer restrains the zinc of the first lead-free solder from diffusing into the first alloy layer. On the other hand, a temperature of the heat-fragile component mounted to the PCB is lowered by the second cooling means before it undergoes the heating step, so that the heat-fragile component undergoes the heating step with a lower temperature. Therefore, use of tin-, silver-, copper-based solder having a high melting point as the second lead-free solder does not damage the heat-fragile component, so that the second alloy layer can be formed. Thus the copper-zinc alloy is suppressed to grow in a high temperature environment. As a result, the solder joint structure formed of zinc-based lead-free solder and free from lowering the joint strength is obtainable.

In the second cooling step of the soldering method of the present invention in the case of soldering a heat-fragile component, the heat-fragile component is cooled such that its peak temperature becomes not higher than the first temperature. This structure allows the second cooling step to cool the heat-fragile component in advance such that its peak temperature becomes lower than the upper limit of quality assurance temperature. The temperature of the heat-fragile component thus will not exceed the quality assurance temperature, so that reflow-soldering can be carried out free from lowering the quality, characteristics, and reliability.

In the heating step, according to the soldering method of the present invention, the first lead-free solder is heated up to its peak temperature, then before the heat-fragile component is heated up to the first temperature, the process moves to the second cooling step to start cooling the heat-fragile component. This procedure allows starting the cool of the heat-fragile component before its temperature exceeds the upper limit of the quality assurance temperature. Therefore, a heat-fragile component of which upper limit of quality assurance temperature is low, or solder having a high melting point can be used in reflow-soldering free from lowering the quality, characteristics, and reliability.

According to the soldering method of the present invention, a transportation from the heating step to the first cooling step is carried out at a temperature of the first lead-free solder lower than the solidus temperature. According to this method, the transportation from the heating means to the cooling means is carried out after the solder becomes solid, so that the component to be soldered is free from interface-delamination or being slanted due to vibrations during the transportation. An excellent soldering can be thus expected.

According to the soldering method of the present invention, the first lead-free solder includes flux component and solder powder. In the pre-heating step, a temperature of the first lead-free solder is set higher than the temperature at which the flux component is activated and the solvent in the flux component vapors, and a temperature of the heat-fragile component is set not higher than the first temperature. This structure allows the pre-heat step to activate the flux in the first lead-free solder, thereby removing films such as oxide film from the PCB or the leads of components to be soldered. As a result, an excellent soldering is achievable. The pre-heat temperature is not higher than the limit of quality assurance temperature, so that the pre-heat means never lowers the quality, characteristics or reliability of the heat-fragile component.

In the pre-heat step of the soldering method of the present invention, the opposite face to the component-mounted face of the PCB, i.e. component-free face, undergoes the pre-heat. The heat-fragile component is thus not directly heated in this structure, so that the temperature thereof will not become high. The second cooling means thus can lower the temperature of the PCB within a short time, namely, the heat-fragile component can be cooled efficiently. The heating means can thus raise the temperature of the first lead-free solder with ease. As a result, the heating means can save power. The temperature of the heat-fragile component does not become so high, the cooling means thus can cool the component well enough not to let the heating means heat the component exceeding the limit temperature of quality assurance.

In the pre-heating step of the soldering method of the present invention, the component-mounted face of the PCB is cooled. This structure allows the pre-heating step to cool the heat-fragile component even when the PCB undergoes the pre-heating step. Therefore, the temperature of the component during the heating step is suppressed lower, so that a heat-fragile component having a lower upper limit of quality assurance temperature, or solder having a higher melting point can be used in reflow-soldering free from lowering the quality, characteristics, and reliability.

In the heating step of the soldering method of the present invention, the component-mounted face of the PCB is cooled. This structure allows the heat-fragile component to be cooled even during the heating process, so that the temperature of the component does not rise so much. The temperature of the component does not exceed the limit temperature of quality assurance before the first cooling means starts cooling, so that the characteristics of the component are not lowered.

In the heating step of the soldering method of the present invention, the PCB is heated from the face where the first lead-free solder is applied. The heat-fragile component is thus not heated in this structure, so that the temperature of the component does not exceed the limit temperature of quality assurance during the heating step.

In the heating step of the soldering method of the present invention, the heating means includes a heating section having a plurality of pipes facing the first lead-free solder applied-face of the PCB. The pipes spout hot-wind heated by the heating section, thereby heating the first lead-free solder. This structure allows applying hot-wind to a local spot, so that the heating time can be shortened and the heating means can save power.

According to the soldering means of the present invention, the heating section of the heating means has an air-room provided at the root of the pipes and shield plate disposed in the air-room. The shield plate has a hole prepared corresponding to the spot soldered on the PCB. The hot-wind is spouted through the pipe coupled to the hole. This structure allows soldering PCBs having different spots soldered with ease by changing only the shield plate.

According to the soldering method of the present invention, a pipe having a larger diameter is coupled to a hole facing a soldering spot where a heat-fragile component having a larger heat capacity is mounted. This structure allows the heating means to heat components within a common time by changing the diameter of the pipe in response to a heat capacity of components. This structure also allows stopping the spout of hot-wind from the pipes simultaneously, so that the soldering can be carried out with ease.

According to the soldering method of the present invention, a number of pipes having a small diameter are disposed toward a spot where a heat-fragile component having a large heat capacity is mounted. This structure allows the heating means to heat components in a common heating time by changing the number of pipes in response to the heat capacity of the component. This structure also allows stopping the spout of hot-wind from the pipes simultaneously, so that the soldering can be carried out with ease.

According to the soldering method of the present invention, in the first cooling step, the PCB is cooled from the heat-fragile component-mounted face. This structure cools forcibly the heat-fragile component with a cooling section, so that the component can be cooled well enough. The temperature of the component can be suppressed to a lower level, so that a component having a low limit temperature of quality assurance and a solder having a high melting point can be used in reflow-soldering.

According to the soldering method of the present invention, in the first cooling step, the first cooling means has a cooling section equipped with a plurality of pipes facing the heat-fragile component mounted-face of the PCB. The heat-fragile component can be selectively cooled by cool-wind spouting from the pipes. This structure allows selectively cooling only the heat-fragile component. To be more specific, a metal frame has a large heat capacity, and if the temperature thereof is lowered, the heating step cannot raise the temperature thereof well enough, so that it is impossible to carry out soldering. Thus the foregoing structure can select a component having a large heat capacity not to be cooled. As a result, excellent soldering can be expected.

According to the soldering method of the present invention, an air-room is provided at the root of the pipes, and a shield plate is disposed in the air-room. The shield plate has a hole corresponding to a spot where a heat-fragile component is mounted to the PCB, and cool-wind spouts from the hole to the component. This structure allows the shield plate to block the flow of the cool wind to the spots requiring no cool wind. Thus only the places to be cooled can be efficiently cooled. PCBs having different soldering spots can be soldered with ease by changing only the shield plate.

According to the soldering method of the present invention, a pipe of larger diameter is provided toward a spot where a heat-fragile component having a large heat capacity is mounted. This structure allows lowering a temperature of a component having a large heat capacity.

According to the soldering method of the present invention, a number of pipes having small diameters are provided toward a spot where a heat-fragile component having a large heat capacity is mounted. This structure allows lowering a temperature of the component having a large heat capacity.

According to the soldering method of the present invention, a heat-fragile component comprises a body having a large heat capacity and a lead, which lead is coupled to the body and has a substantially smaller diameter than that of the body. Since the lead to be soldered has a substantially smaller diameter than that of the body, the heat of the lead heated in the heating step hardly travels to the body. Thus a temperature of the body can be maintained at a low level even in the heating process, so that it does not exceed its failure temperature or its characteristics proof temperature.

A manufacturing apparatus of electronic components of the present invention is structured as follows: A soldering apparatus comprises the following elements, which apparatus solders a pad formed of copper foil and provided at a given place on an insulated substrate to a lead of an electronic component mounted at the pad with lead-free solder:

a printing means for printing second lead-free solder onto the pad formed on the substrate;

a first heating means for heating the substrate, on which the second lead-free solder is printed, thereby forming a first alloy layer on the pad, which layer being formed of the second lead-free solder layer connected to a tin-copper alloy layer;

a transcribing means for transcribing first lead-free solder, having a melting point lower than the second lead-free solder, on the pad after the formation of the first alloy layer;

an inserting means for inserting a lead of an electronic component into a hole, provided at a substantial center of the pad, after the transcription of the first lead-free solder; and a second heating means for heating the substrate after the insertion of the lead, the second heating means including:

a pre-heat section for preheating the first lead-free solder up to a rst given temperature;

a first cooling section for cooling the first lead-free solder after the preheat;

a heating section for heating the first lead-free solder after the cooling up to a second temperature higher than the first temperature; and a second cooling section for cooling the first lead-free solder melted by the heating section after the first lead-free solder reaches the second temperature.

The heating section melts both of the first and the second lead-free solders, so that a second alloy layer is formed between the first alloy layer and the first lead-free solder layer.

The foregoing structure allows the heating section to melt both of the first and the second lead-free solders. At the melting, the zinc of the first lead-free solder and the copper molecules diffusing into the first alloy layer are bound together, thereby forming the second alloy layer (copper-zinc) between the first lead-free solder and the first alloy layer. This formation consumes the copper molecules diffusing in the fist alloy layer, so that the copper density of the first alloy layer lowers, and the copper-zinc layer hardly grows further. In other words, the formation of the second alloy layer suppresses the diffusion of zinc of the first lead-free solder into the first alloy layer. Thus the copper-zinc alloy is suppressed to grow in a high temperature environment. As a result, the solder joint formed of zinc-based lead-free solder and free from lowering the joint strength is obtainable.

Further, since the temperature of the electronic component is lowered by the cooling section of the heating means, the temperature rise by the heating section of the first lead-free solder to a temperature, at which the second lead-free solder is melted, does not so much cause a temperature rise of the component. Therefore, if a first lead-free solder (e.g. tin-, silver, copper-based lead-free solder) having a melting point higher than a heatproof temperature of the electronic component (e.g. electrolytic capacitor) is used, the component can be soldered at a temperature lower than its heatproof temperature.

According to a manufacturing apparatus of electronic components of the present invention, first lead-free solder includes tin and zinc, and second lead-free solder includes tin and indium. This structure allows soldering at a low temperature, so that this structure is useful for soldering a heat-fragile component.

A melting point of the tin-, zinc-based first lead-free solder can be approximated to that of the second lead-free solder. Those two lead-free solders can be thus melted at a low temperature, so that the second alloy layer is obtainable at a low temperature. The electronic component having a low heatproof temperature can be thus soldered free from being damaged by heat.

BRIEF DESCRIPTION OF THE DRAWINGS

FIG. 13(a) shows a front view of a manufacturing apparatus, and illustrates a heating step of soldering in accordance with a second exemplary embodiment of the present invention.

FIG. 13(b) shows an enlarged sectional view illustrating places soldered of a PCB used in the manufacturing apparatus shown in FIG. 13(a).

FIG. 16(a) shows a front view of a soldering apparatus in accordance with a third exemplary embodiment of the present invention.

FIG. 16(b) shows a sectional view of a transporting means on which the PCB shown in FIG. 16(a) is placed.

DETAILED DESCRIPTION OF THE INVENTION

Exemplary embodiments of the present invention are demonstrated hereinafter with reference to the accompanying drawings.

Exemplary Embodiment 1

Figure 1:
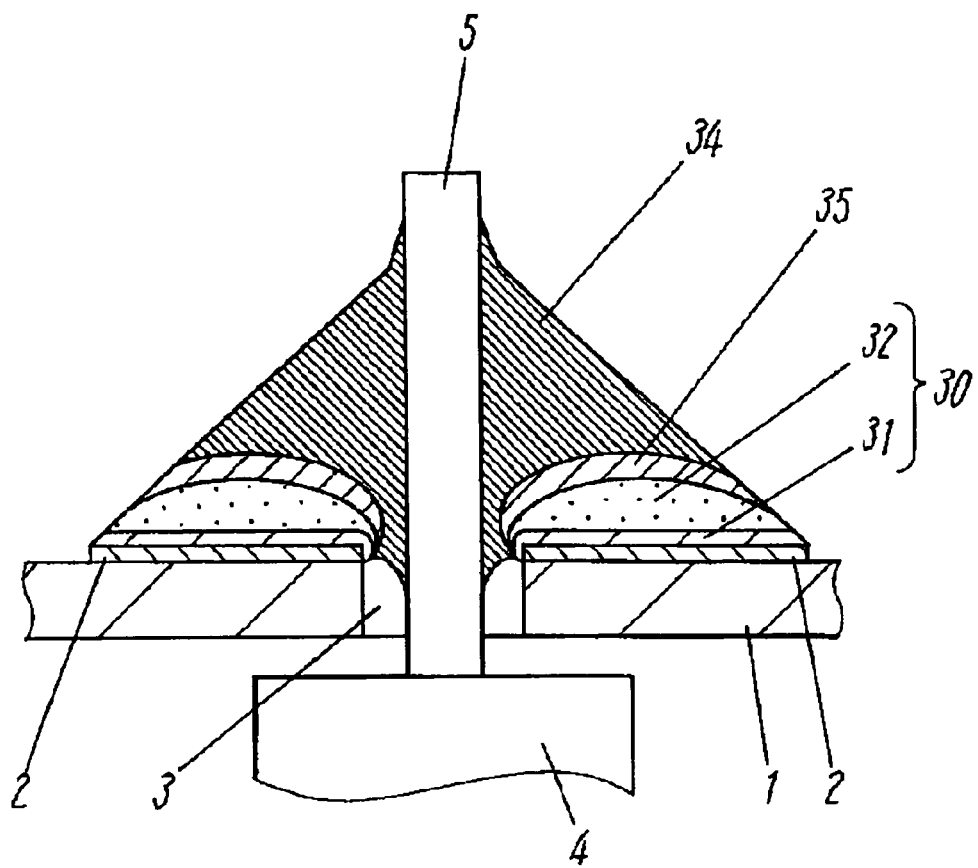
FIG. 1 is a schematic sectional view illustrating a joint structure of soldering in accordance with a first exemplary embodiment of the present invention.
Figure 2:
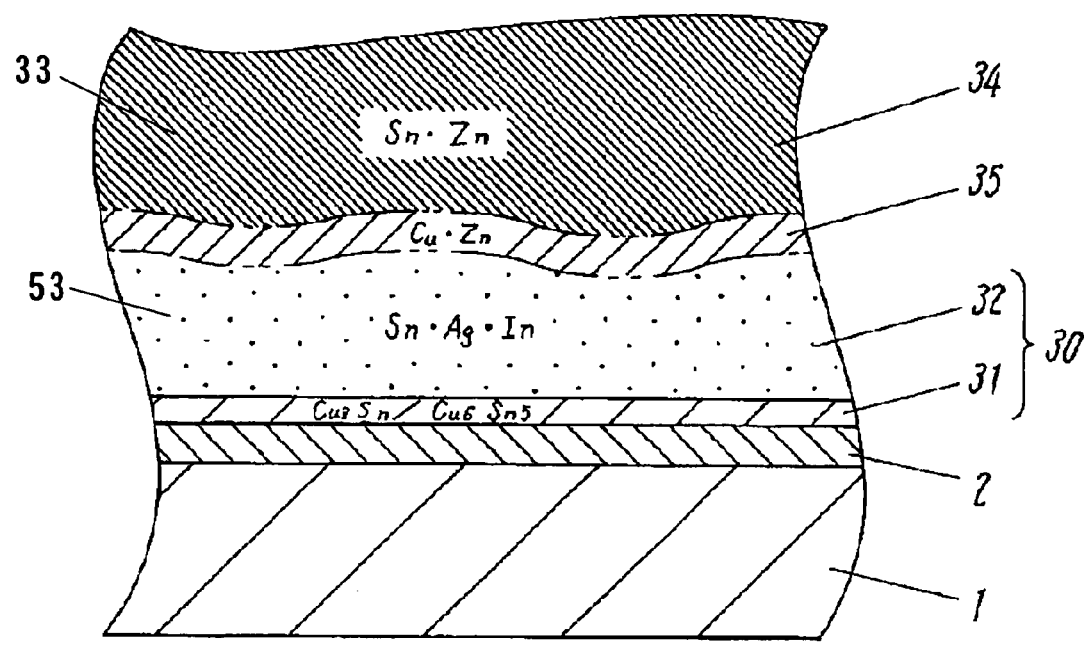
FIG. 2 shows a schematically enlarged view of an essential part of FIG. 1.
Figure 17:
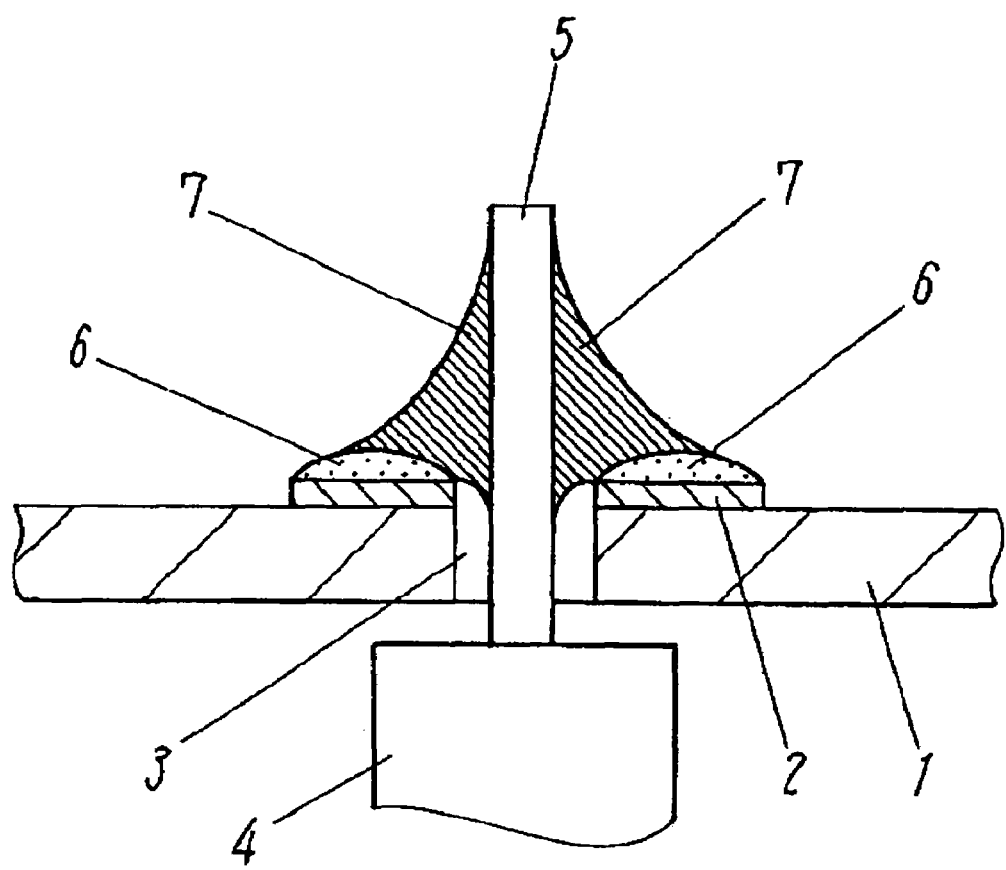
FIG. 17 shows a sectional view of a conventional solder joint structure.
Figure 18:
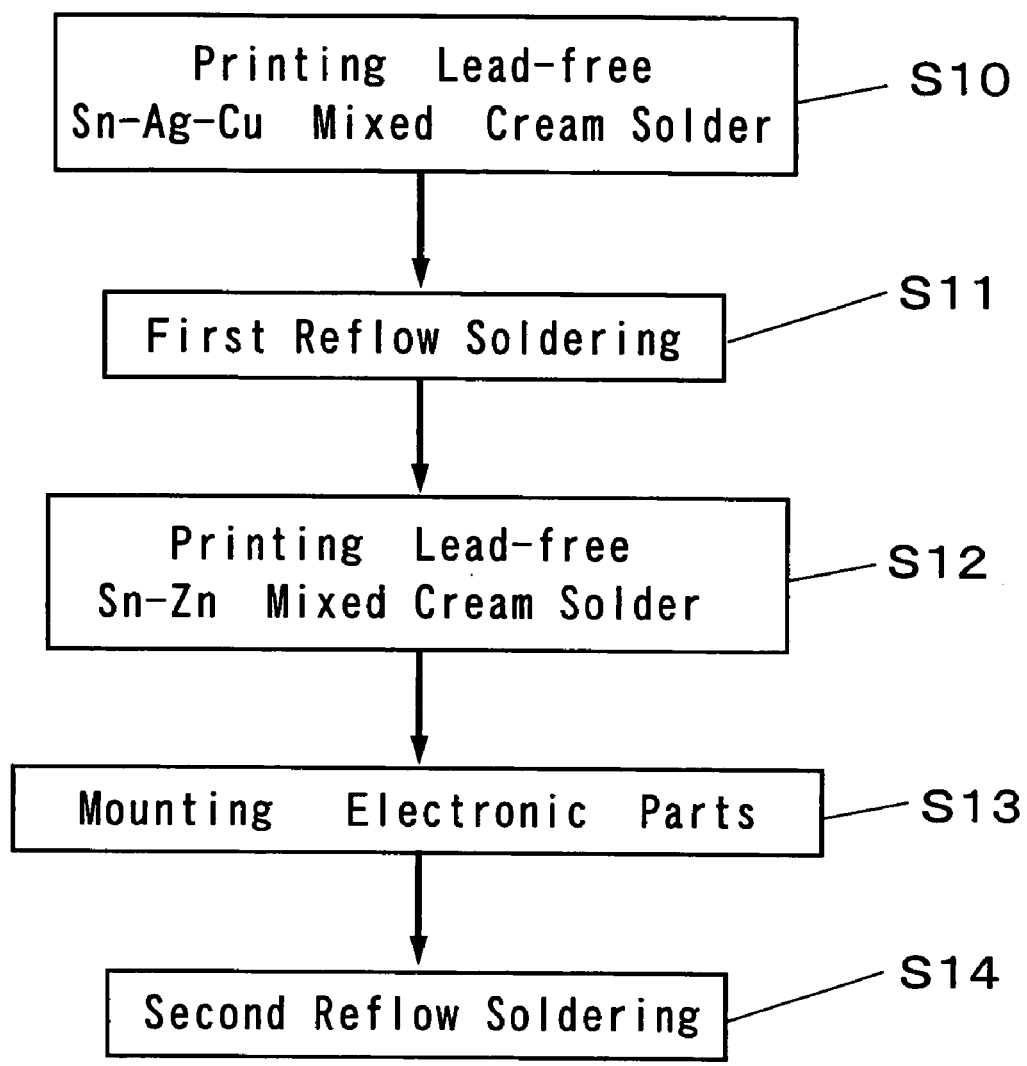
FIG. 18 shows a flowchart illustrating a conventional soldering procedure.
Figure 19:
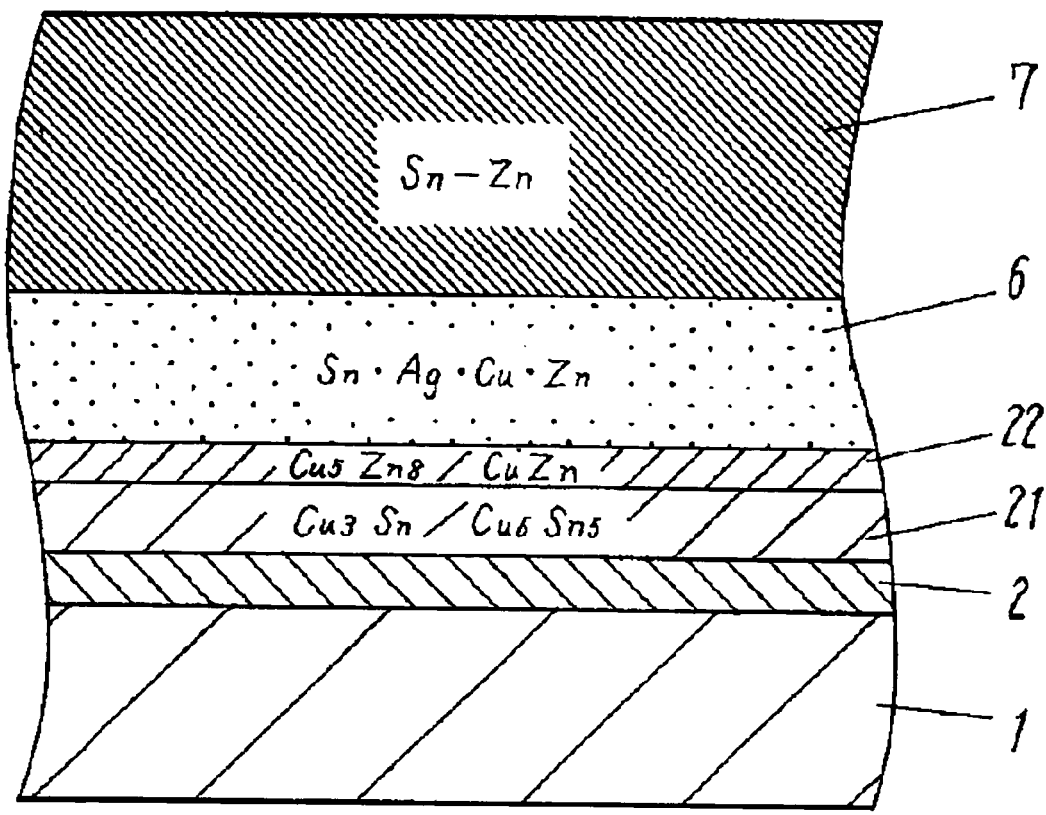
FIG. 19 shows an enlarged sectional view illustrating an essential part of the conventional solder joint structure.

FIG. 1 is a schematic sectional view illustrating a joint structure of soldering in accordance with a first exemplary embodiment of the present invention. FIG. 2 shows a schematically enlarged view of an essential part of FIG. 1. In FIGS. 1 and 2, similar elements to those in FIGS. 17 and 19 illustrating the prior art have the same reference marks, and the descriptions thereof are simplified here to avoid duplication.

In the enlarged view shown in FIG. 2, boundaries between respective layers are explicitly drawn; however, the boundaries are only for explanatory purpose. Actually, each component ratio varies time-dependently and such explicit boundaries do not exist. In the present invention, however, the boundaries are shown in order to illustrate ranges recognizable with SEM pictures as the layers.

In FIGS. 1 and 2, soldering pad (hereinafter referred to simply as "pad") 2 is formed of copper foil at a given place on printed circuit board (PCB) 1 made of insulating material. First alloy layer 30 is formed on pad 2, and tin-copper alloy layer 31, having approx. 3 mm thickness, made of $Cu_3Sn$ alloy and $Cu_6Sn_5$ alloy of approx. 3 mm thick is formed beneath first alloy layer 30, i.e. on first layer 30 facing pad 2. Tin-, silver-, indium-based lead-free solder (hereinafter referred to simply as "indium-based lead-free solder") layer 32 is formed, as an instance of second lead-free solder, on the surface side of first alloy layer 30.

On the upper most surface, namely, the farthest surface from pad 2, tin-, zinc-based lead-free solder layer 34, an instance of first lead-free solder (hereinafter referred to simply as "zinc-based lead-free solder"), is formed. Between first alloy layer 30 and the zinc-based lead-free solder layer 34, second alloy layer 35 made from copper and zinc is formed.

An approx. thickness of each layer shown below is an example:
  tin-copper alloy layer 31: 3 μm.
  indium-based lead-free solder layer 32 formed on layer 31: 50 μm
  second alloy layer 35: 4 μm.

Component 4 with leads, namely a subject to be soldered in the first embodiment, e.g. an electrolytic capacitor, includes lead 5 to be soldered. Lead 5 is inserted into hole 3 punched at PCB 1, and soldered with zinc-based lead-free solder, so that component 4 is electrically coupled to PCB 1.

Figure 3:
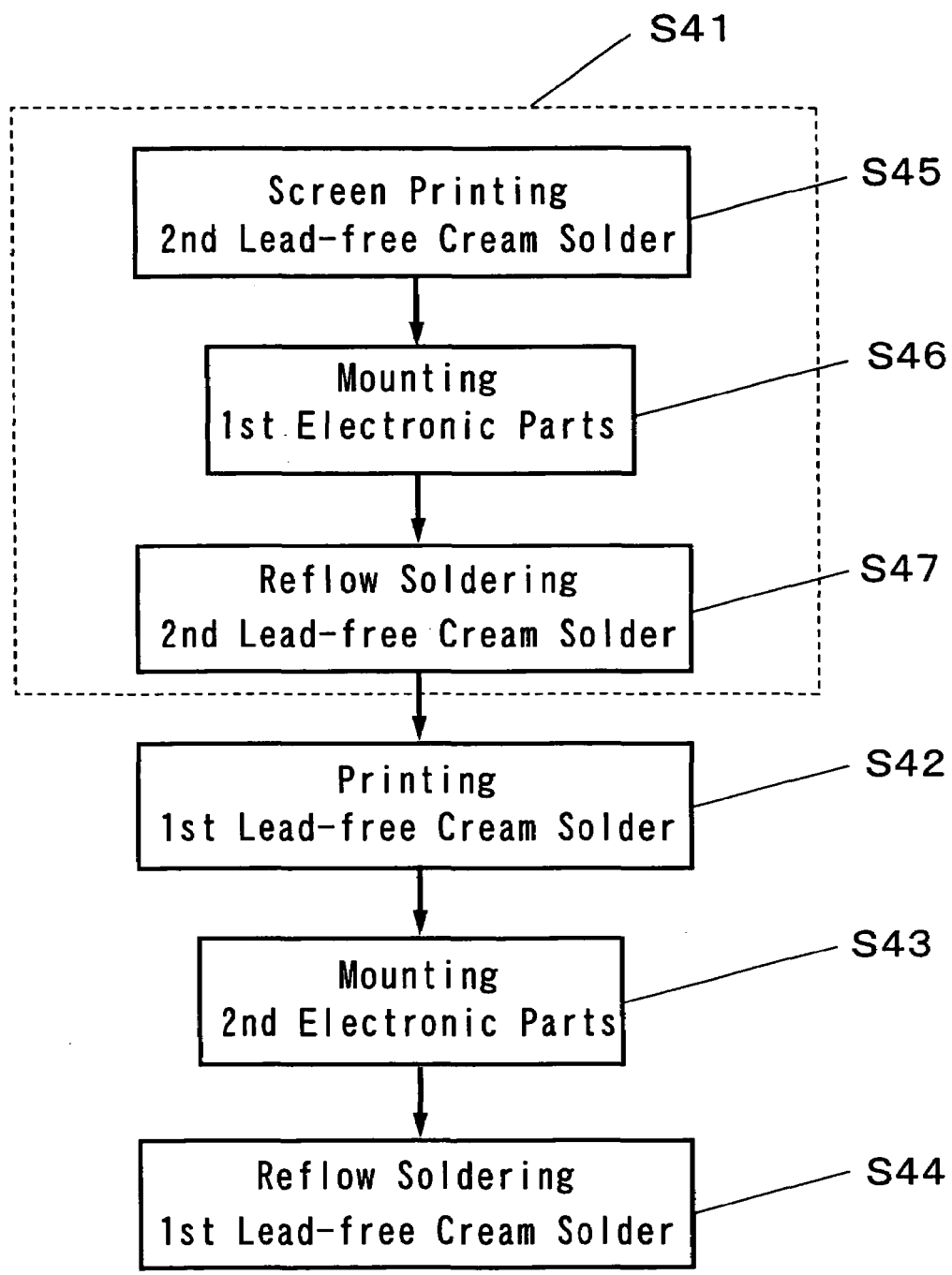
FIG. 3 shows a flowchart illustrating a soldering process in accordance with the first exemplary embodiment of the present invention.

Next, soldering steps in accordance with the first embodiment are demonstrated hereinafter. FIG. 3 shows a flowchart illustrating the soldering procedure in accordance with the first exemplary embodiment. As shown in FIG. 3, the soldering procedure comprises the steps of:

alloy layer forming step S41 of forming first alloy layer 30 on pad 2;
  solder applying step S42 of supplying solder cream or solder paste of zinc-based lead-free solder for application onto first alloy layer 30 after step S41;
  component inserting step S43 of inserting component 4 with leads into hole 3 of PCB 1 after step S42; and
  soldering step S44 of heating and melting zinc-based lead-free solder after step S43.

Alloy layer forming step S41 includes the following steps of
  printing step S45 of printing cream or paste of indium-based lead-free solder on pad 2;
  component mounting step S46 of mounting chip components by, e.g. automatic mounting machine, after step S45; and
  reflow step (or melting step) S47 of heating and melting the indium-based lead-free solder after step S46.

Respective steps shown in FIG. 3 are described hereinafter one by one with reference to relevant drawings. First, printing step S45 is demonstrated with reference to FIG. 4, which shows a sectional view illustrating a status where a metal screen is placed on a PCB in order to demonstrate printing step S45. Plural pads 2, 51a, and 51b are formed on PCB 1. Pad 2 is soldered to lead 5 of electronic component 4. Pads 51a, 51b are formed toward leads (electrodes) of chip components to be described later.

Metal screen 52 is placed on PCB 1, and cream 53 (ink or paste can be also acceptable) of indium-based lead-free solder is supplied onto metal screen 52. Cream 53 is imprinted by squeegee 54 into openings 55, 56a, 56b provided to metal screen 54, and supplied to pads 2, 51a, 51b as predetermined. Cream 53 is formed of, e.g. tin 88 wt %, silver 3.5 wt %, indium 8 wt %, bismuth 0.5 wt %. Opening 55 to be used for chip component faces pad 2, and openings 56a, 56b face pads 51a, 51b.

Figure 5:
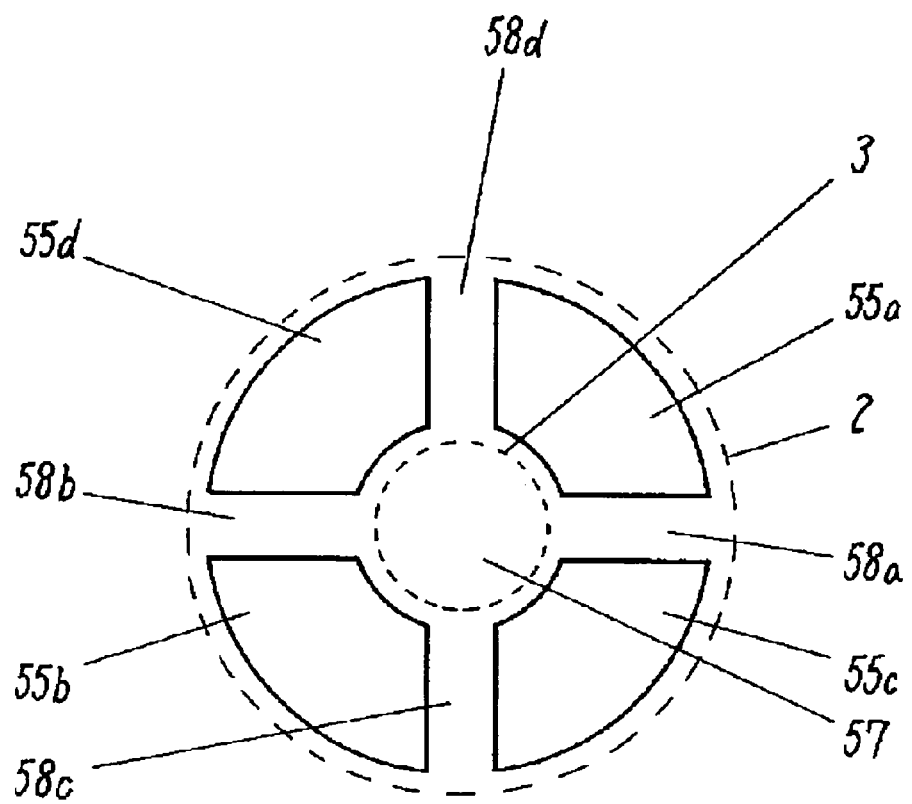
FIG. 5 details an opening of a screen used in printing step S45.

In this embodiment, metal screen 52 of 120 μm thick is used. At the center of opening 55, conical shield 57 is formed such that it covers hole 3 as shown in FIG. 5. A diameter of shield 57 is set larger than that of hole 3 by, e.g. 0.4 mm, so that even if screen printing is deviated, cream 53 will not attach inside of hole 3.

Opening 55 is divided into four openings 55a, 55b, 55c, and 55d by couplers 58a, 58b, 58c and 58d, which are prepared for firmly holding shield 57. Paste 53 leaves some uncovering areas 62 (refer to FIG. 6) on those four couplers, so that the width of those couplers is preferably as narrow as possible.

In this first embodiment, the width of those four couplers is set, e.g. approx. 0.2 mm. This preparation allows first alloy layer 30 to be formed with ease, by melting indium-based lead-free solder 53, on areas 62 uncovered with cream 53. In the first embodiment, four couplers are used; however, at least two couplers work enough. A fewer number of couplers can reduce uncovered areas 62, so that first alloy layer 30 can be formed more positively.

Figure 6:
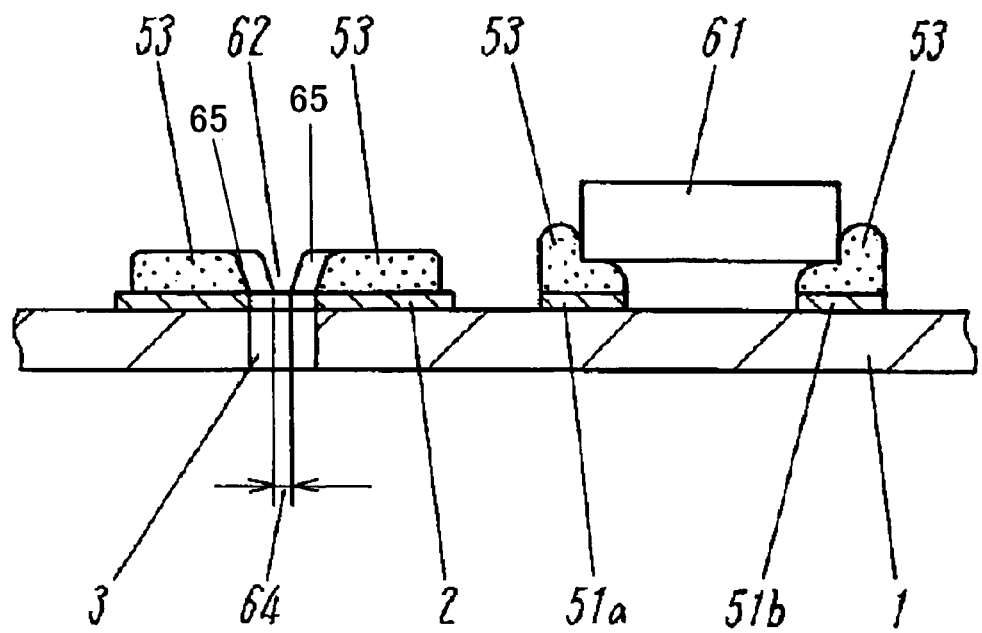
FIG. 6 shows a partial sectional view illustrating a status where a chip component is mounted on a PCB in mounting step S46.

FIG. 6 shows a partial sectional view illustrating a status where a chip component is mounted on a PCB in mounting step S46. In step S46, chip component 61 is mounted by, e.g. an automatic mounting machine, to indium-based lead-free solder 53 supplied in printing step S45. Solder 53 has a melting point of 206° C. which is higher than that of conventional tin-, lead-based eutectic cream solder by approx. 23° C. In this component mounting step S46, only the components bearable to a reflow temperature proper to indium-based lead-free solder 53 can be mounted. This proper reflow temperature ranges in general from 225 to 230° C., and general-purpose chip components 61 actually have heatproof temperatures higher than this range, so that almost all the chip components can be used.

In general, more than several minutes are required before the mount of the chip components is completed since the previous step, i.e. printing step S45. Therefore, run is produced from solder 53, and the run shortens the spaces between uncovered areas 62 shown in FIG. 6. Since couplers 58 shown in FIG. 5 have a width of 0.2 mm, component mounting step S46 can shorten width 64 of uncovered areas 62 to as narrow as 0.1 mm.

Figure 7:
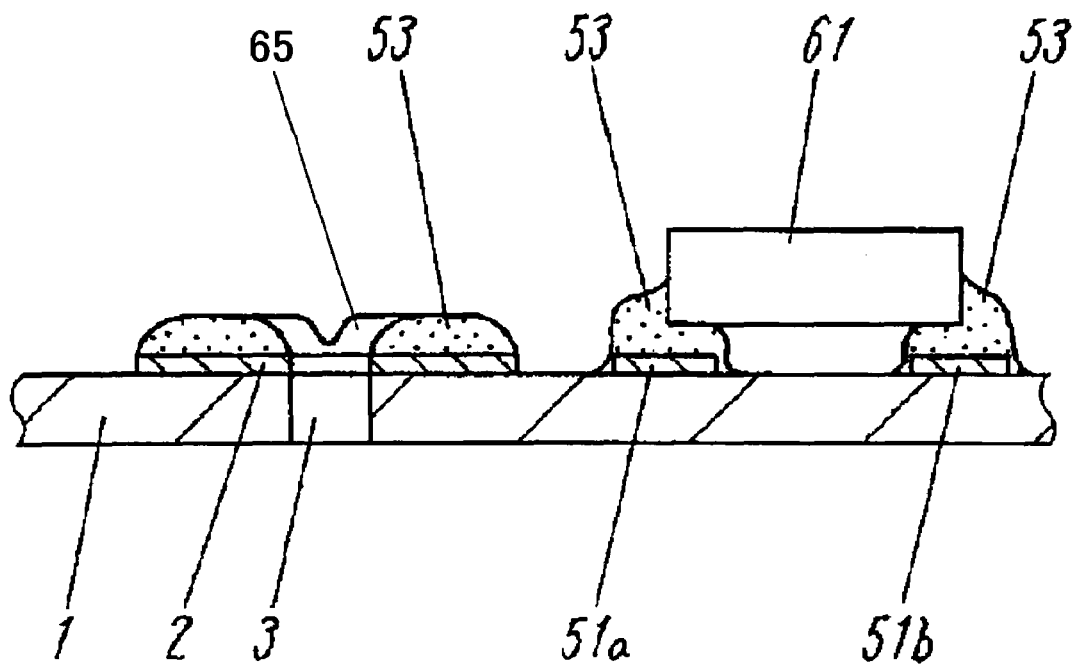
FIG. 7 shows a partial sectional view of a PCB for illustrating a status where indium-based cream solder is heated in melting step S47.
Figure 8:
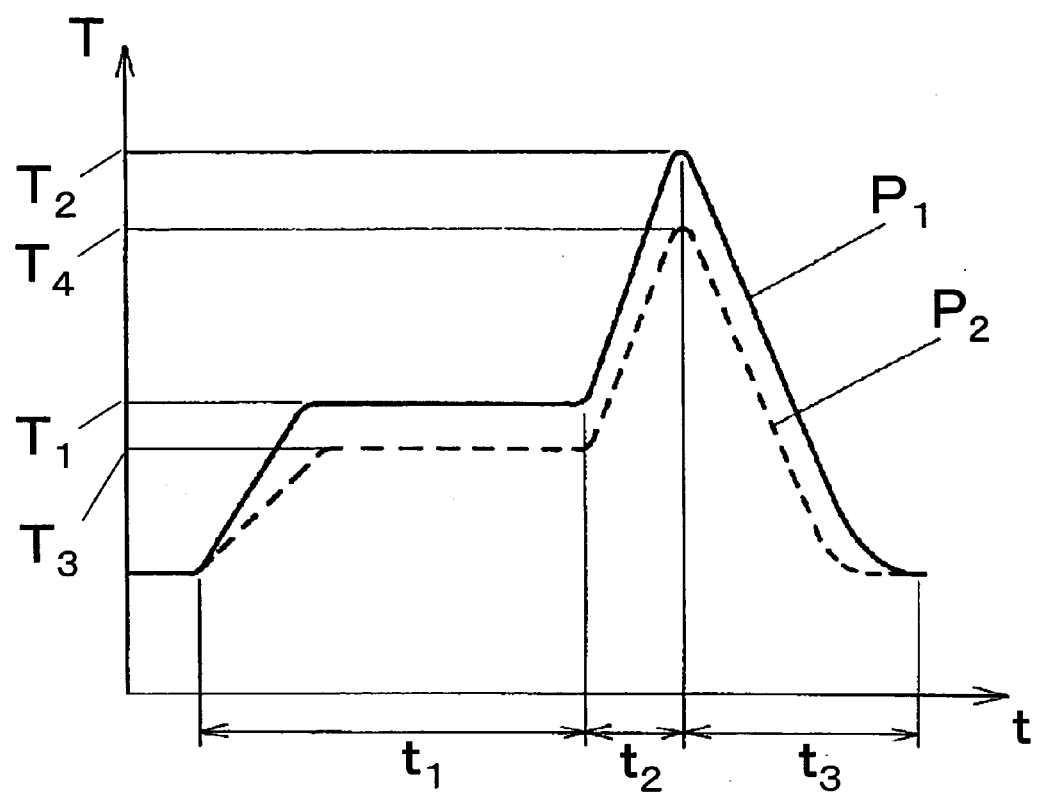
FIG. 8 is a graph showing a temperature profile of melting step S47.

FIG. 7 shows a partial sectional view of a PCB for illustrating a status where indium-based cream solder is heated in melting step S47. FIG. 8 is a graph showing a temperature profile of melting step S47. In FIG. 8, lateral axis "t" represents time, and vertical axis "T" represents temperature.

In FIG. 8, temperature profile P1 of indium-based lead-free solder 53 is shown with a bold-solid line. Pre-heating time is shown with "t1", and a pre-heated temperature is shown with "T1", e.g. 160° C. This pre-heat vaporizes the solvent component of solder 53 as well as energizes the flux component, thereby cleaning the surfaces, i.e. the surface of a subject to be soldered, of pad 2 or electrodes of electronic component 4. The pre-heat also lowers the viscosity of solder 53, and solder 53 thus runs. This run 65, namely solder 53, covers uncovered area 62.

Next, the step moves on to the main heat. As shown in FIG. 8, the main heat takes time "t2", and during time "t2", solder 53 is heated up to a temperature over its melting point, so that indium-based lead-free solder 53 is melted. The peak temperature of the main heat is "T2", e.g. 225° C., so that solder 53 can be positively heated up to the temperature exceeding its melting point, 206° C. The cooling step cools melted solder 53 down to approx. ambient temperatures and it takes time "t3". Those steps discussed above allow soldering chip-component 61 and forming first alloy layer 30 on pad 2.

Figure 4:
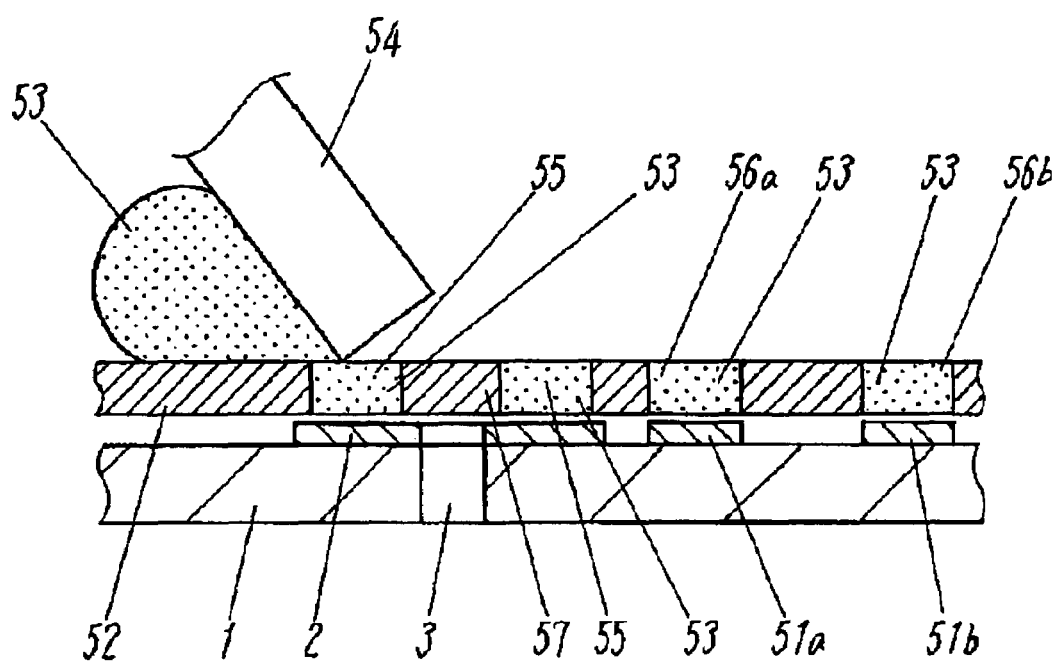
FIG. 4 shows a sectional view illustrating a status where a metal screen is placed on a PCB in order to demonstrate printing step S45.
Figure 9:
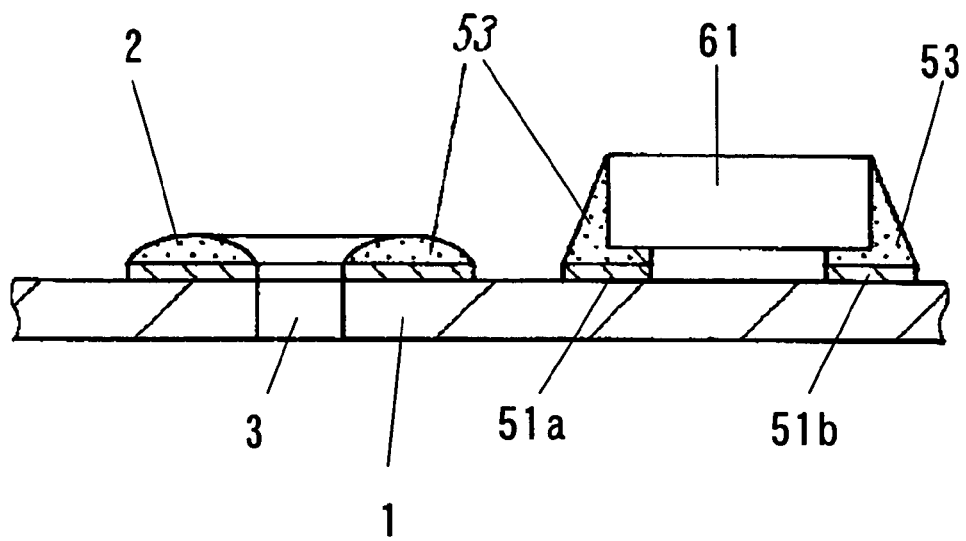
FIG. 9 shows a partial sectional view of a PCB on which indium-based lead-free solder has been cooled.

FIG. 9 shows a partial sectional view of a PCB on which indium-based lead-free solder 53 has been cooled. In FIG. 9, when solder 53 is melted, the volume of solder 53 decreases by its solvent component to approx. a half. However, as FIG. 4 shows opening 55 of metal screen 52 in printing step S45, the dimensions in accordance with the first embodiment of the present invention allows solder 53 to spread substantially over the entire surface of pad 2 except hole 3. As a result, first alloy layer 30 is formed as shown in FIG. 1.

Figure 10:
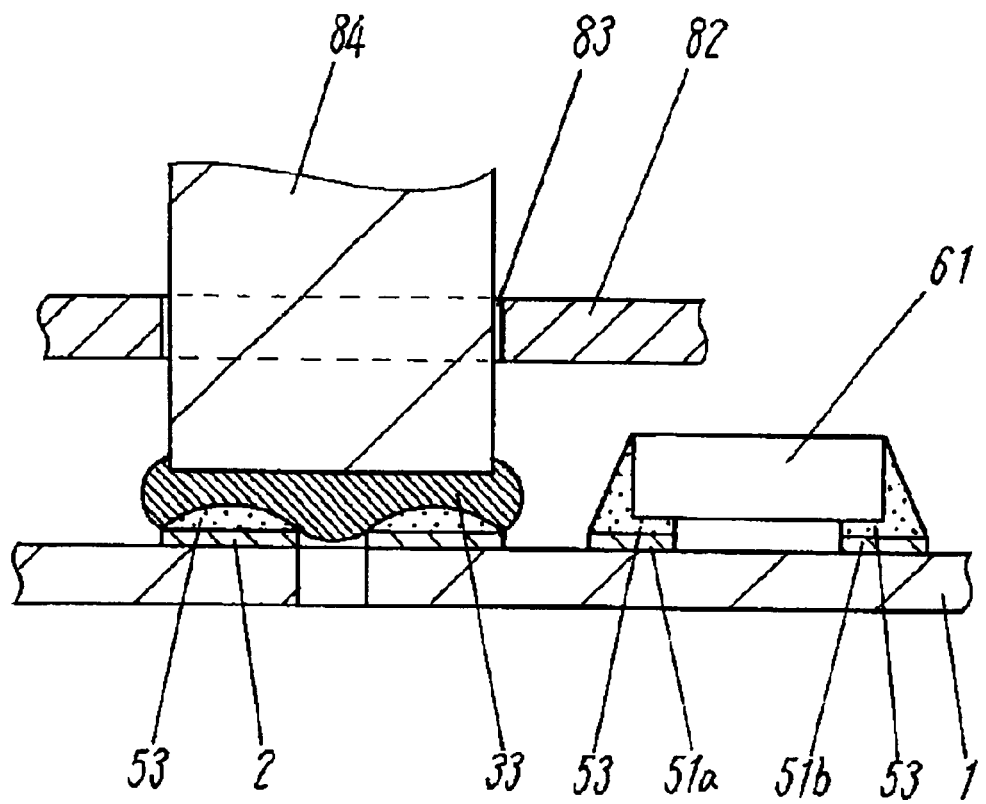
FIG. 10 shows a partial sectional view of a PCB, and illustrates solder application step S42.

Next, the step moves on to solder applying step S42. FIG. 10 shows a partial sectional view of a PCB, and illustrates solder application step S42. In FIG. 8, P2 represents the temperature profile of tin-lead eutectic solder and is shown with a bold broken line. Peak temperature T4 of temperature profile P2 is lower than peak temperature T2 of temperature profile P1 of solder 53 by approx. 10° C. To be more specific, soldering component 4 with leads such as an electrolytic capacitor requires zinc-based lead-free solder having a melting point near to that of the conventional lead-tin eutectic solder. Because the electrolytic capacitor has a lower heat resistance (its heatproof temperature is 160° C.) than chip component 61, so that solder having a melting point near to that of the conventional lead-tin eutectic solder, is needed. The zinc-based lead-free solder used in this first embodiment has the following composition: tin=89 wt %, zinc=8 wt %, bismuth=3 wt %. This solder has melting point of 197° C., and its pre-heat temperature of P2 is T3, where the relation of T3<T1 is found.

In solder applying step S42, first of all, zinc-based lead-free solder 33 is supplied onto indium-based lead-free solder 53. Supply of solder 33 onto PCB 1 forms, e.g. imprinting hole 83 on plate 82 having a thickness of 1.2 mm at the place where hole 83 faces pad 2. Solder 33 is imprinted into hole 83, and then pushed out by pin 84 having slightly smaller diameter than that of hole 83, and transcribed onto solder 53. Solder 33 is bulged laterally by pin 84, when pin 84 presses solder 33. The diameter of hole 83 is thus set smaller than that of pad 2 by approx. 0.2 mm in order to prevent the bulge from shorting with adjacent components.

Figure 11:
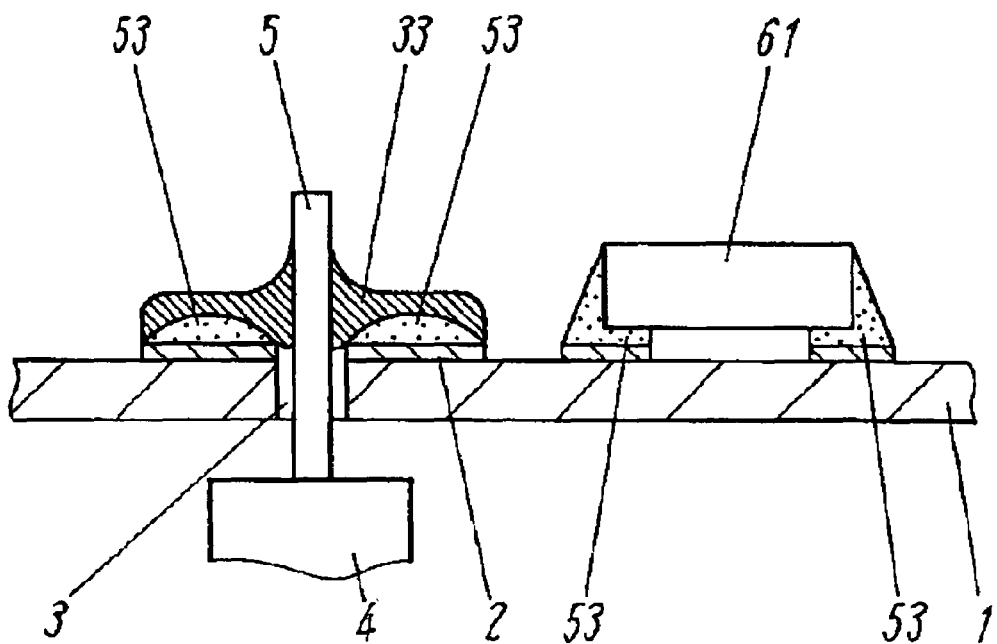
FIG. 11 shows a sectional view of a PCB for illustrating insertion step S43.

FIG. 11 shows a sectional view of a PCB for illustrating insertion step S43 in which an electronic component having a low heatproof temperature is mounted. To be more specific, lead 5 of component 4 with leads having a low heatproof temperature, such as an electrolytic capacitor, is inserted into hole 3 of pad 2. Zinc-based lead-free solder 33 has been transcribed inside hole 3 in solder applying step S42.

The last step of the flowchart shown in FIG. 3 is soldering step S44, where lead 5 of electrolytic capacitor 4 is soldered by melting zinc-based lead-free solder 33. This first embodiment can employ a reflow furnace generally used.

Figure 12:
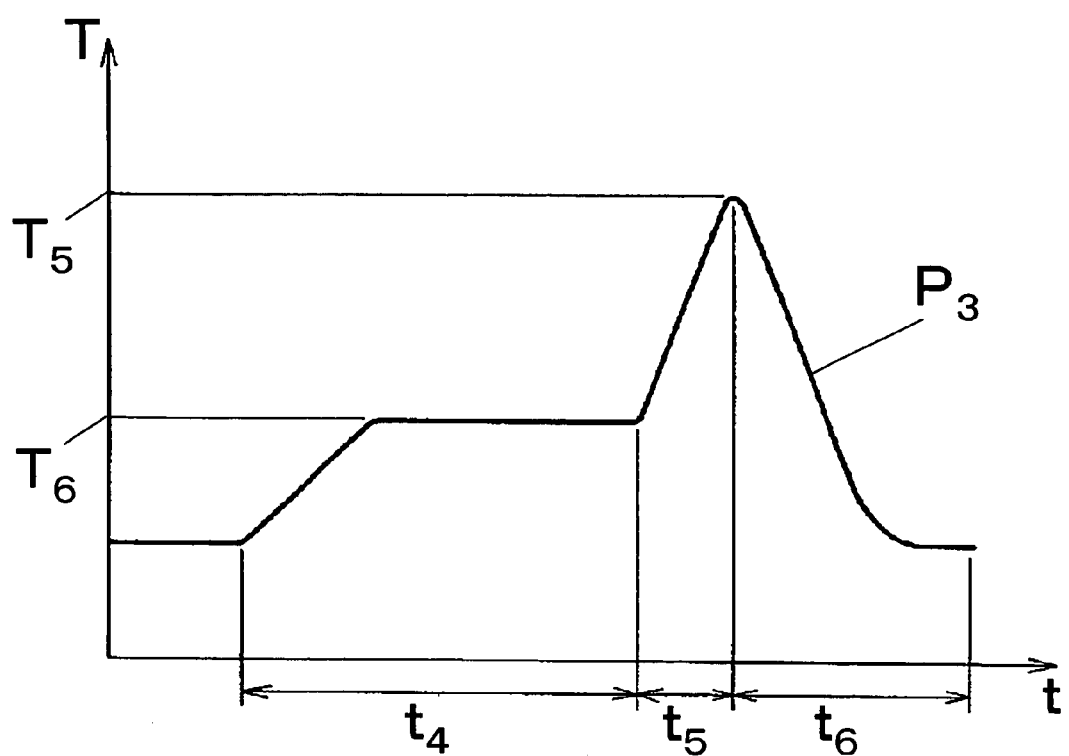
FIG. 12 shows a temperature profile of soldering step S44 in accordance with the first exemplary embodiment of the present invention.

FIG. 12 shows a temperature profile of soldering step S44 in accordance with the first exemplary embodiment of the present invention. In FIG. 12, lateral axis "t" represents time, and vertical axis "T" represents temperature, so that FIG. 12 has a similar structure to that of FIG. 8 which shows the temperature profile of melting step S47. At temperature profile 3 in FIG. 12 of soldering step S44, zinc-based lead-free solder 33 is pre-heated up to preheat temperature T5, then in time T4, solder 33 undergoes the main heat for time t5, so that the temperature T5 is raised up to T4 before soldering. Then solder 33 is cooled down to an approx. ordinary temperature taking time t6. The soldering is thus completed.

Formations of an alloy layer in the respective steps are described hereinafter with reference to FIG. 1 and FIG. 8. First, in alloy layer forming step S41, indium-based lead-free solder 53 printed using a screen of, e.g. 120 μm thick, on pad 2, is heated and melted in the reflow furnace for soldering. In this step, the copper of pad 2 is bound to the tin of solder 53, so that copper-tin alloy layer 31 made of $Cu_3Sn$ and $Cu_6Sn_5$ is formed. On top of copper-tin alloy layer 31, second lead-free solder 32 made of indium-based lead-free solder 53 is formed. First alloy layer 30 made of both the foregoing layers is thus formed. A thickness of respective layers is this: copper-tin alloy layer 31=3 μm, second lead-free solder layer 32=50 μm.

Next, in solder applying step S42, zinc-based lead-free solder 33 is applied onto second lead-free solder layer 32 made of indium-based lead-free solder 53, then component 4 such as an electrolytic capacitor is inserted in component inserting step S43. Soldering step S44 carries out the soldering. The steps discussed above form second alloy layer 35 formed of copper-zinc between second lead-free solder layer 32, made of tin-copper alloy layer 31 and indium-based lead-free solder 53 on pad 2, and first lead-free solder layer 34, made of zinc-based lead-free solder 33.

The foregoing structure allows first lead-free layer 34 and pad 2 to sandwich first alloy layer 30 and second alloy layer 35, so that the zinc of the layer 34 made of zinc-based lead-free solder 33 hardly reaches the copper foil passing through those barrier layers. This mechanism prevents the copper-zinc alloy in soldering step S44 from developing between alloy layer 31 and second lead-free solder layer 32 made of indium-based lead-free solder 53. Further in a high temperature environment, it is confirmed that the copper-zinc alloy layer is suppressed to develop.

In actual, a soldered point in accordance with the first embodiment is kept at 125° C. for 1000 hours, then the soldered point undergoes SEM analysis, which tells that no copper-zinc alloy layer is developed between second lead-free solder layer 32 and copper-tin alloy layer 31.

As discussed above, use of the solder joint structure of the present invention proves that first alloy layer 30 and second alloy layer 35 positively prohibit the zinc of first lead-free alloy layer 34 formed of zinc-based lead-free solder 53 from entering into the copper foil. The mechanism of this prohibition is considered as follows: In soldering step S44, both of first lead-free solder layer 34 and second lead-free solder layer 32 are heated up to 215° C., so that indium-based lead-free solder 53 having a higher melting point is melted. At this time, the zinc of first lead-free layer 34 and the copper molecules diffusing from the copper foil in reflow step S47 into first alloy layer 30 are both activated, i.e. they are tend to bind to each other. The binding of those two elements forms second alloy layer 35 around the boundary between second lead-free solder layer 32 made of indium-based lead-free solder 53 and first lead-free solder layer 34 made of zinc-based lead-free solder 33.

The copper molecules diffusing into first alloy layer 30 are gradually consumed, so that the copper density in first alloy layer 30 lowers, and finally the supply of copper from first alloy layer 30 is discontinued. Then second alloy layer 35 formed of copper and zinc develops at a slower pace because of no further supply of copper. The solder joint structure is cooled and solidified in this state, so that the zinc of first lead-free solder layer 34 cannot reach pad 2.

In other words, both of first and second lead-free solder layers 32 and 34 are melted in soldering step S44, thereby lowering the copper density in second layer 32 as well as developing second alloy layer 35. The foregoing mechanism thus suppresses the development of the copper-zinc alloy between second lead-free solder layer 32 and alloy layer 31.

The solder joint structure thus formed is left in a high temperature environment, such as at 125° C. for 1000 hours, before being undergone the SEM analysis, which analysis then tells that no development of second alloy layer 35 is observed. This observation is detailed below.

The formation of second alloy layer 35 lowers the copper density in second lead-free solder layer 32 formed of indium-based lead-free solder 53, so that solder 53 has a little copper to be bound to the zinc. As a result, even the solder joint structure is left in the high temperature environment for a long time, no development of the second alloy layer is observed.

As described above, first alloy layer 30 is formed on pad 2, and second alloy layer 35 is formed between first alloy layer 30 and first lead-free solder layer 34 made of zinc-based lead-free solder 33. This structure suppresses the zinc of solder 33 to pass through first alloy layer 30 and reach pad 2, and also suppresses the growth of second alloy layer 35 per se in a high temperature environment. As a result, the solder joint structure formed of zinc-based lead-free solder and free from lowering the joint strength is thus obtainable.

In this first embodiment, indium-based lead-free solder 53 is used for forming second lead-free solder layer 32; however, the present invention is not limited to this case, and use of other material such as tin-, silver, copper-based lead-free solder can also form second alloy layer 35. Actually, in the case of using the tin-, silver, copper-based lead-free solder, it is confirmed that the raise of the temperature in soldering step S44 up to approx. 240° C. binds the zinc in zinc-based lead-free solder 33 to the copper in the tin-, silver, copper-based lead-free solder, so that second alloy layer 35 is formed.

In this case, similar to the case of using indium-based lead-free solder 53, both of the zinc-based lead-free solder and the tin-, silver, copper-based lead-free solder are brought into melting status, so that the zinc in zinc-based solder 33 is bound to the copper in the tin-, silver, copper-based solder.

However, the tin-, silver, copper-based lead-free solder includes copper of approx. 0.5 wt %, and this copper is bound to the zinc in first lead-free solder layer 34, so that the width of second alloy layer 35 becomes wider in the case of using the tin-, silver, copper-based lead-free solder. This first embodiment thus reduces the copper content and uses the indium-based lead-free solder, so that the width of second alloy layer 35 can be narrowed because the lead-free solder includes less amount of copper. As a result, the solder joint structure free from lowering the joint strength is thus obtainable.

According to the soldering method using the solder joint structure in accordance with the first embodiment of the present invention, when first alloy layer 30 is formed on pad 2, chip component 61 can be soldered simultaneously. This advantage eliminates some processes dedicated to the formation of first alloy layer 30, such as a plating process. As a result, inexpensive soldering using the lead-free solder can be expected.

In general, the lead-free solder including zinc-based lead-free solder 33 has low solderability; however, as shown in the first embodiment, the surface of pad 2 is covered with indium-based lead-free solder 53 in advance, so that the solderability becomes better.

In this first embodiment, soldering only about pad 2 on PCB 1 is discussed; however, about other places, e.g. on lead 5 of a component having leads such as an electrolytic capacitor, it had better to form the first alloy layer. In this case, since the surface area of lead 5 is substantially smaller than that of pad 2, first alloy layer 30 can be thinner, and it can be formed by plating.

Exemplary Embodiment 2

An electronic-component manufacturing apparatus to be used in soldering in accordance with the second exemplary embodiment is demonstrated hereinafter with reference to FIG. 13-FIG. 15. FIG. 13(a) shows a front view of a manufacturing apparatus. FIG. 13(a) illustrates a heating step of soldering in accordance with the second exemplary embodiment of the present invention. FIG. 13(b) shows an enlarged sectional view illustrating places soldered of a PCB used in the manufacturing apparatus shown in FIG. 13(a). Similar elements to those in the prior art or the first embodiment have the same reference marks, and the descriptions thereof are simplified here. The steps of soldering in accordance with the second embodiment are basically the same as shown in the flowchart of FIG. 3 used in the first embodiment. The steps of the second embodiment differ from those of the first one in soldering step S44 which uses a reflow, so that soldering step S44a instead of S44 is used in the second embodiment.

In this second embodiment, tin-, silver-, copper-based lead-free solder is used as second lead-free solder. In order to form the second alloy layer around this tin-, silver-, copper-based lead-free solder, while a heating temperature in soldering step S44a is raised, the heating temperature should be regulated not to exceed a heat-proof temperature of heat-fragile component 123 such as component 4 with leads (e.g. electrolytic capacitor).

In FIG. 13, surface-mounted components (not shown) are soldered in advance on both the surfaces of PCB 1 with tin-, silver-, copper-based lead-free solder 100 in alloy-forming step S41. First alloy layer 101, made of tin-, silver-, copper-based lead-free solder 100 and tin-copper alloy, is formed in advance on pad 2. Zinc-based lead-free solder 122 is supplied to pad 2 by transcription in solder applying step S42. Heat-fragile component 123 such as an electrolytic capacitor or an IF transformer having a low limit temperature of quality assurance is inserted into hole 3. PCB 1 is accommodated in shielding case 124 made from metal. Heat-fragile component 123 has a rather larger shape and is formed of body 123a having a large amount of heat capacity and leads 123b soldered to body 123a. A soldered place of component 123 is formed of, e.g. copper wire of 0.3 mm across. This diameter is substantially smaller than the diameter of body 123a. Lead 123b employs copper wire of good heat conductivity so that heat travels with ease through lead 123b. As a result, lead 123b is easy to be soldered.

Transport means 125 for transporting PCB 1 is disposed such that its transporting face forms right angles (vertical) with respect to the gravity direction, and transports PCB 1 in the horizontal direction. Transport means 125 can employ a steel conveyor, so that magnets 127 are mounted at given intervals. Shielding case 124 is mounted to transport means 125 by magnets 127 with cream-soldered face of PCB1 facing downward.

Both the surfaces of PCB 1 are open, so that nothing blocks hot-wind or cool-wind in the soldering apparatus. Thus the hot-wind or cool-wind is efficiently given to the solder on PCB 1 or heat-fragile component 123, so that power of the heat source can be minimized and the power consumption of the soldering apparatus can be reduced.

Transport means 125 transports PCB 1 firstly to preheat means 128, which has pre-heater 129a under transport means 125 for preheating zinc-based lead-free solder 122. Pre-heater 129a preheats solder 122 up to approx. 120-150° C. The preheat temperature is preferably as high as possible in order to reduce the power consumed by a heating means; however, it should be set not to exceed a quality-assurance limit temperature of the electronic component of which lead is to be soldered. To meet this condition, preheat means 128 has cooling section 130 above transport means 125. This cooling section 130 blows cool-wind only to heat-fragile component 123 so that the temperature of component 123 will not rise.

PCB 1 passes through preheat means 128 and enters into cooling means 131 linked to preheat means 128. In cooling means 131, cooling section 130, the same one as used in preheat means 128, is also prepared above transport means 125 for suppressing the temperature-rise of component 123. PCB 1 undergoes cooling means 131 and enters into heating means 132 linked to cooling means 131. Heating means 132 melts zinc-based lead-free solder 122 for soldering and has heating section 129b under transport means 125.

Cream solder, in general, is heated up to a temperature higher than its liquidus temperature by approx. 30° C. for soldering. Zinc-based lead-free solder 122 has a liquidus temperature of 197° C., so that heating means 132 should heat solder 122 up to approx. 230° C. However, a heat-fragile component such as a general-purpose electrolytic capacitor or an IF transformer has a quality-assurance limit temperature of approx. 160° C., so that the heat temperature of cream solder 22 by heating means 132 should be set as low as possible such as around 210° C.

As already discussed in embodiment 1, soldering step S44a is required to heat and melt tin-, silver-, copper-based lead-free solder 100 having a high melting point in order to form the second alloy layer between tin-, silver-, copper-based lead-free solder 100 and zinc-based lead-free solder 122. Since tin-, silver-, copper-based lead-free solder 100 has the melting point of approx. 217° C., soldering step S44a desirably heats solder 100 up to at least over 230° C.

Cooling means 131 is prepared between preheat means 128 and heating means 132 in order to regulate the temperature of body 123a not to exceed the limit temperature, although solder 100 is heated up to 230° C. by heating means 132. Body 123a is thus temporarily cooled by cooling section 130 of cooling means 131. Further, heating means has cooling section 130, the same one as that of preheat means 128, above PCB 1 for cooling heat-fragile component even during the heat process.

PCB 1 undergoes heating means 132 and is transported by transport means 125 to cooling means 133 linked to heating means 132. Cooling means 133 cools the melted cream solder down to approx. an ambient temperature. PCB 1 is then taken out from the exit.

Figure 14:
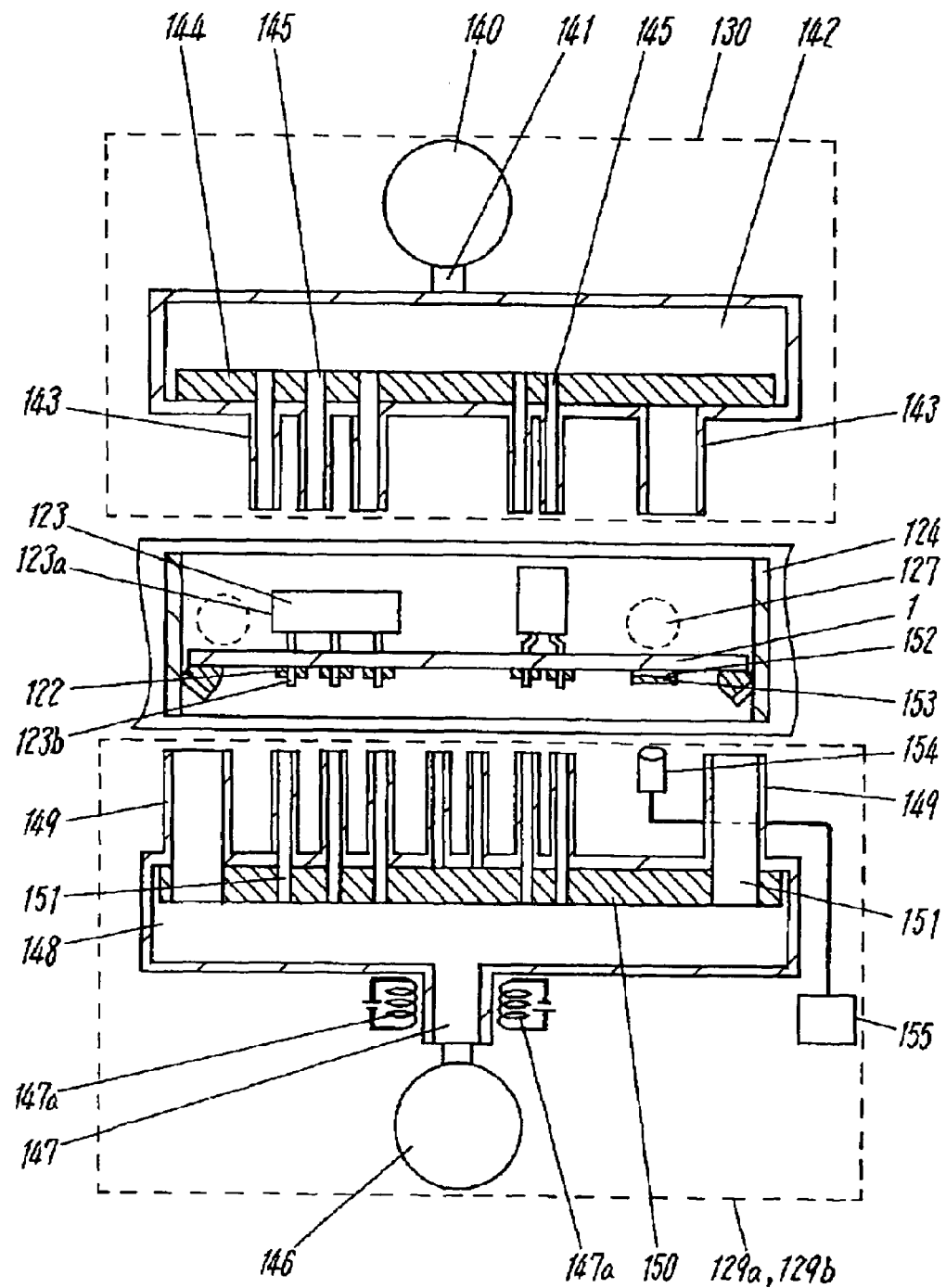
FIG. 14 shows a sectional view illustrating a vicinity of a heating section and a cooling section of a manufacturing apparatus using a solder joint structure in accordance with the second exemplary embodiment of the present invention.

FIG. 14 shows a sectional view illustrating a vicinity of a heating section and a cooling section of a manufacturing apparatus using the solder joint structure in accordance with the second exemplary embodiment of the present invention. Cooling section 130 disposed above transport means 125 is demonstrated with reference to FIG. 14.

As shown in the upper section of FIG. 14, air-guiding pipe 141 coupled to air supplying device 140 guides air to air room 142, which has plural pipes 143 corresponding to a mounting position of heat-fragile component 123. Pipes 143 have a larger diameter in response to a component having a lower heat-proof temperature. The foregoing structure of cooling section 130 effectively suppresses the temperature-rise of component 123, so that a component having a lower heat-limit temperature can undergo the reflow soldering. In the manufacturing apparatus used in the second embodiment, pipes 143 having a larger diameter are used in order to increase the cooling effect; however use of a greater number of pipes 143 instead of the larger diameter also produces a similar effect.

Shielding plate 144 is prepared between air room 142 and pipes 143, and plate 144 has holes 145 so that air passes through holes 145 to hit the place where heat-fragile component 123 is placed. This structure allows cooling only heat-fragile component in an efficient manner. Change of shielding plate 144 allows handling a PCB having a heat-fragile component at a different place from another one. Meanwhile, every pipe 143 can be disposed equidistantly and only the positions of holes 145 of plate 144 can be changed for controlling the cooling section. In this case, preparation of shielding plates 144 having holes 143 at different positions from each other can handle any PCBs 1 by simply replacing shielding plate 144 with another one.

Next, heating section 129a, 129b shown in the lower section of FIG. 14 are demonstrated. The air, supplied from air-supplier 146 passes through air-guiding pipe 147 which has heating body 147a outside thereof and coupled to air-supplier 146, is heated up to a given temperature. The heated air is guided to air-room 148, and passes through holes 151 provided to shielding plate 150, then passes through pipes 149 and heats zinc-based lead-free solder 122. In the case of soldering a component such as a frame having a greater heat capacity, pipes 149 having a larger diameter are used. Instead of using pipes 149 of a larger diameter, use of a greater number of pipes 149 can produce a similar effect.

Shielding plate 150 is prepared in air-room 148 for supplying heated air (warm-wind) only to necessary spots. Plate 150 thus has holes 151 for the heated air to pass through and hit the spots where heat-fragile component 123 is mounted. This structure allows heating only zinc-based lead-free solder 122 in an efficient manner. Change of shielding plate 150 allows handling a PCB having a heat-fragile component at a different place from another one. Meanwhile, every pipe 149 can be disposed equidistantly and only the positions of holes 151 of plate 150 can be changed for controlling the heating section. In this case, preparation of shielding plates 150 having holes 151 at different positions from each other can handle any PCBs 1 by simply replacing shielding plate 150 with another one.

Copper foil 152 for measuring a temperature is prepared to PCB 1, and cream solder 153 is also applied to copper foil 152. The temperature of body 123a of heat-fragile component 123 is calculated by calculator 155 coupled to non-contact temperature measuring device 154 which is supposed to measure the temperature of cream solder 153. The actual temperature of cream solder 153 can be thus measured, so that the temperature of body 123a can be controlled with ease based on the temperature-data measured. The temperature of heat-fragile component 123 thus does not exceed the limit temperature.

Heating section 129a of preheat means 128 and heating section 129b of heating means 132 are the same except the capacity of heating body 147a, so that a capacity-change of heating body 147a for changing a set temperature allows handling different conditions.

Figure 15:
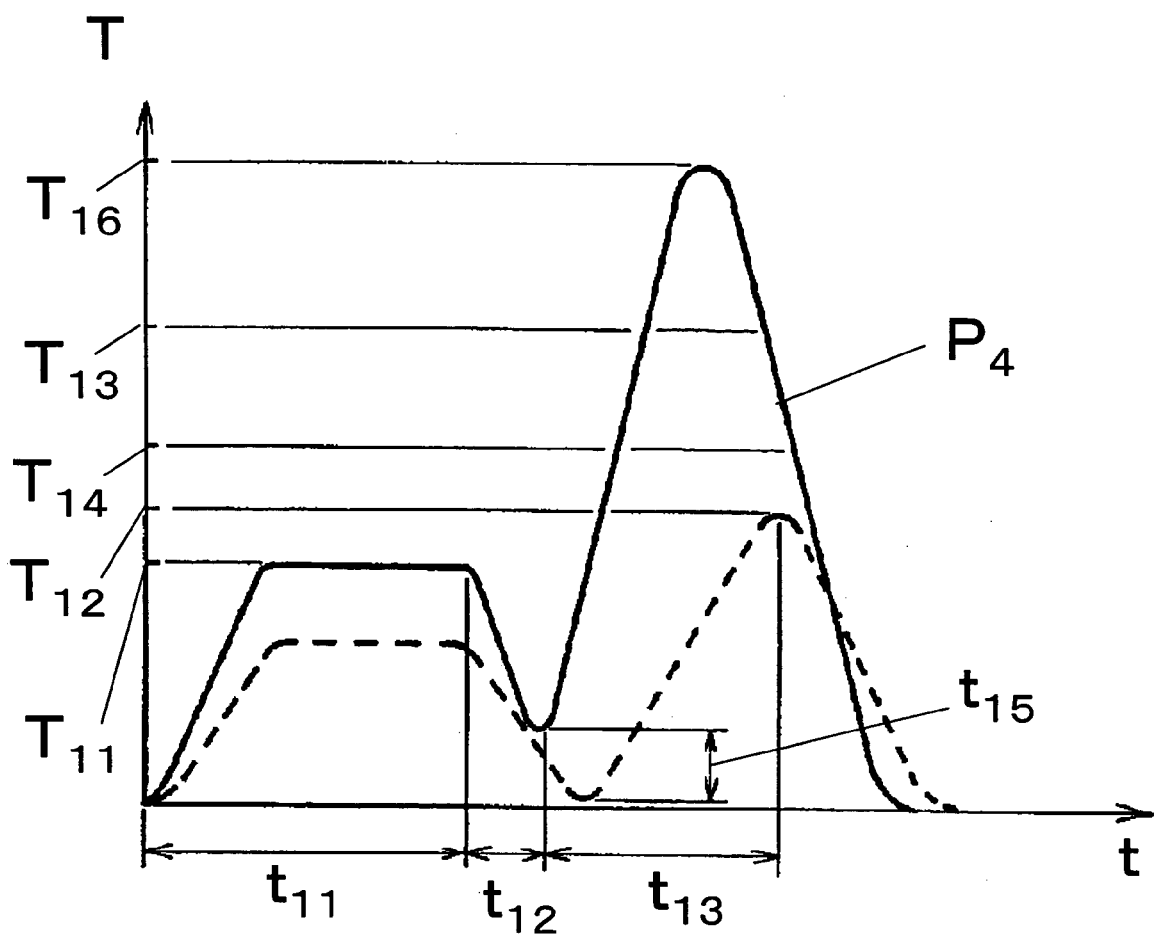
FIG. 15 shows a temperature profile of soldering step S44a in accordance with the second exemplary embodiment of the present invention.

Next, FIG. 15 shows a temperature profile of soldering step S44a in accordance with the second exemplary embodiment of the present invention. In step S44a, body 123a of heat-fragile component 123 is soldered with zinc-based lead-free solder 122. The procedure of the soldering in accordance with the second embodiment is demonstrated hereinafter with reference to profile P3 shown in FIG. 15 and the manufacturing apparatus shown in FIG. 13(*a*).

Preheat means 128 shown in FIG. 13(*a*) preheats zinc-based lead-free solder 122 for time $t_{11}$ up to temperature $T_{11}$. At this time, the temperature of body 123a is regulated to be not higher than limit temperature $T_{14}$, specifically, to fall within the range from, e.g. 120° C. to 150° C. This preparation activates the flux component of solder 122, which is formed of solder powder and the flux component, and vaporizes the solvent thereof. The flux component includes resin, activator, thixotropic agent, and solvent. In other words, the flux in solder 122 is activated by the preheat, so that the flux removes film, such as oxide film that covers the copper foil of PCB 1 or lead 123b. As a result, excellent soldering can be expected. The vaporization of solvent due to the preheat prevents the gas dissolving in the solvent from exploding, so that solder spatter, voids (pin-hole, blow-hole) in fillet can be avoided. Meanwhile the gas has dissolved in the solvent due to sharp heating done by heating means 132.

Next, cooling means 131 cools body 123a for time $t_{12}$ down to approx. the ambient temperature. Preheat means 128 and cooling means 131 have cooling sections 130 respectively facing only heat-fragile component 123, so that the temperature of body 123a can be substantially lowered in a short time without much lowering the temperature of zinc-based lead-free solder 122. This preparation produces greater temperature difference $T_{15}$ between body 123a and solder 122 before heating means 132 starts heating.

Heating for time $t_{13}$ by heating means 132 raises the temperature of both of tin-, silver-, copper-based lead-free solder 100 and zinc-based lead-free solder 122 up to a temperature higher than liquidus temperature $T_{13}$ of solder 100, and melts both of those solders. Body 123a of heat-fragile component 123, on the other hand, is cooled by cooling section 130 in this heating step, so that its temperature can be kept low. Further, body 123a has a large heat-capacity, and lead 123b has a substantially smaller diameter than body 123a, so that the heat of lead 123b heated by heating means 132 hardly travels to body 123a.

The foregoing mechanism allows the temperature of body 123a to rise slower than that of solder 122 or lead 123b. Therefore, although the temperature of solder 122 lowers, the temperature of body 123a still rises for a while. If zinc-based lead-free solder 122 is heated up to specified peak temperature $T_{16}$, the peak temperature of body 123a can be lower than limit temperature $T_{14}$ proportionately to the greater portion of the temperature difference between solder 122 and body 123a at the start of the heating by heating means 132.

After the heating for time $t_{13}$ by heating means 132, cooling means 133 starts cooling. At this time body 123a starts undergoing the cooling step at a temperature lower than limit temperature $T_{14}$. At the start of cooling, PCB 1 is transported by transport means 125 not before the temperature of solder 122 becomes lower than its solidus temperature. The foregoing preparation allows starting the cooling before the temperature of body 123a exceeds limit temperature $T_{14}$, so that the temperature of body 123a never exceeds its breakdown temperature or characteristics-assurance temperature $T_{14}$. Since PCB 1 is transferred after zinc-based lead-free solder 122 is completely solidified, no interface-detachment due to vibrations caused by transport is expected.

The soldering procedure discussed above allows forming the second alloy layer even when the lead-free solder having a lower melting point is applied and soldered onto an alloy layer formed of tin-, silver-based lead-free solder or tin-, silver-, copper-based lead-free solder having a higher melting point. At the same time, the temperature of body 123a of heat-fragile component 123 can be kept not higher than limit temperature of 162° C., so that heat-fragile component 123 can be reflow-soldered with the lead-free solder having a high melting point. Thus the temperature of heat-fragile component 123 never exceeds limit temperature T14, so that component 123 can be soldered with the lead-free solder. The present invention can thus provide an environmentally friendly soldering apparatus.

The apparatus described in the soldering procedure in accordance with the second embodiment can solder even if heat-fragile component 123 such as an IF transformer with lead-free solder and can achieve a quality mounting of the component.

In the soldering procedure discussed previously, tin-, silver-, copper-based lead-free solder 100 is used; however, the present invention is not limited to this instance, e.g. indium-based lead-free solder can be used instead. The indium-based lead-free solder has a lower melting point than that of solder 100, and yet, has a small difference in melting point of zinc-based lead-free solder. Use of the indium-based solder thus can form the second alloy layer at a lower temperature, so that a heat-fragile component having a lower heat-proof temperature can be soldered.

Exemplary Embodiment 3

A soldering apparatus in accordance with the third exemplary embodiment of the present invention is demonstrated hereinafter. FIG. 16(a) shows a front view of the soldering apparatus in accordance with the third embodiment, and FIG. 16(b) shows a sectional view of a transporting section on which a PCB shown in FIG. 16(a) is placed.

In FIG. 16(b) and FIG. 17, similar elements to those used in the second embodiment have the same reference marks, and the descriptions thereof are simplified here.

Transport means 200 for transporting PCB 1, on which heat-fragile component 123 is mounted, is formed of two lines of chain, and extends through reflow-furnace 201 at the substantial center of furnace 201. Pallet 202 is placed on transport means 200, and PCB 1 mounted with heat-fragile component 123 and accommodated in metal shielding case 124 is placed on pallet 202. Holes 203 are provided to pallet 202 at the places corresponding to lead 123b of component 123. Those holes 203 allow reflow-furnace 203 to heat locally lead 123b. Preheat means 204, cooling means 205, heating means 206, and cooling means 207 are disposed in reflow-furnace in this order.

Firstly, preheat means 204 includes heating section 208 under transport means 200 for preheating, and heating section 208 is formed of plural far-infrared heaters and hot-wind blowers. In the soldering apparatus in accordance with the third embodiment, preheat means 204 has cooling section 209 over transport means 200, and cooling section 209 regulates the temperature of body 123a of component 123 mounted on PCB 1 not to rise. Cooling means 205 next to heating section 208 includes cooling section 210 over transport means 200 for lowering the temperature of body 123a down to approx. the ambient temperature.

Next, heating means 206 includes heating section 211 under transport means 200 for heating and soldering zinc-based lead-free solder 122, and heating section 211 is formed of plural far-infrared heaters. Heating means 206 also has cooling section 209 over transport means 200 for regulating the temperature of body 123a not to rise.

Some of reflow-furnaces 201 available in the market include far-infrared heaters over transport means 200 at preheat means 204, cooling means 205, and heating means 206 respectively, so that PCB 1 can be heated from its above. When such reflow-furnace 201 is used, those far-infrared heaters are turned off, so that the heating from above PCB 1 is stopped, and the temperature of body 123a will not rise.

Before the temperature of body 123a reaches the limit temperature of the component due to heating means 206, pallet 202 carrying PCB 1 is transported by transport means 200 to cooling means 207, where cooling section 212 cools PCB 1.

The foregoing soldering apparatus can regulate the temperature of a heat-fragile component at a low level similar to the soldering apparatus described in embodiment 1. Therefore, use of this soldering apparatus allows forming the second alloy layer by melting both of the tin-, silver-, copper-based lead-free solder and zinc-based lead-free solder. At the same time, the temperature of the heat-fragile component never exceeds the limit temperature, so that the component can be soldered with the lead-free solder.

The soldering apparatus in accordance with the third embodiment does not need a specially designed reflow-furnace, but it can use a reflow-furnace generally available in the market with a simple modification. The lead-free soldering can thus carried out without any substantial modification cost.

As discussed above, the solder joint structure of the present invention solders a lead of an electronic component to a soldering pad made from copper foil at a given place on an insulated PCB with first lead-free solder. To be more specific, on the pad, a first alloy layer is formed, this first alloy layer is made of a second lead-free solder layer connected to a tin-copper alloy layer. Between the first alloy layer and the first lead-free solder layer, a second alloy layer is formed.

The first and the second alloy layers work as barrier layers against the zinc, so that the zinc hardly passes through those barrier layers or reaches the copper foil to form an alloy. In other words, copper-zinc alloy, which weakens the joint strength, is hardly produced between the first lead-free solder and the pad. As a result, the solder joint structure formed of zinc-based lead-free solder and free from lowering the joint strength is thus obtainable.

What is claimed is:

1. A method of soldering plural pads formed of copper foil on an insulated substrate to a lead of an electronic component mounted to the plural pads with lead-free solder, the method comprising:
    applying one of paste, ink and cream of second lead-free solder on the plural pads including a first pad and a second pad, mounting a first electronic component to the first pad, and heating to melt the second lead-free solder;
    applying one of paste, ink and cream of first lead-free solder on the second lead-free solder applied on the second pad having a hole;
    mounting a lead of a second electronic component into the hole of the second pad applied with the first lead-free solder; and
    heating to melt the first lead-free solder.

2. The soldering method of claim 1, wherein the first lead-free solder has a substantially identical melting point to that of the second lead-free solder.

3. The soldering method of claim 1, wherein the first lead-free solder comprises tin and zinc.

4. The soldering method of claim 1, wherein the second lead-free solder comprises tin and indium.

5. The soldering method of claim 1, wherein in the applying of one of paste, ink and cream of second lead-free solder on the second pad, the mounting of a first electronic component to the first pad, and the heating to melt the second lead-free solder, a first alloy layer comprising a second lead-free solder layer connected to a tin-copper alloy layer is formed on the second pad by heating to melt the second lead-free solder.

6. The soldering method of claim 1, wherein the second lead-free solder is applied by screen printing.

7. The soldering method of claim 6, wherein a screen used in the screen printing comprises an opening formed toward the second pad, and a shield formed toward a hole provided at a substantial center of the second pad such that the shield covers the hole.

8. The soldering method of claim 7, wherein the opening has a coupler coupled to the shield, wherein a width of a place, where the second lead-free solder is not applied, of the coupler is set such that run of the second lead-free solder due to being heated at a section facing the place, where the second lead-free solder is not applied, covers the place.

9. The soldering method of claim 1, wherein in the heating to melt the first lead-free solder, the second lead-free solder are melted with the first lead-free solder.

10. The soldering method of claim 9, wherein in the heating to melt the first lead-free solder, a second alloy layer, formed of copper diffusing into a first alloy layer and zinc included in the first lead-free solder, is formed between the first alloy layer and the first lead-free solder layer.

11. The soldering method of claim 1, wherein the second electronic component is a heat-fragile component, and the heating to melt the first lead-free solder including:
preheating lead-free solder up to a predetermined first temperature;
first cooling for suppressing temperature rise by a first cooling means after the preheating;
heating the first lead-free solder and the second lead-free solder together up to a second temperature with a heating means for melting after suppressing temperature rise; and
second cooling with a second cooling means both of the first lead-free solder and the second lead-free solder melted by the heating.

12. The soldering method of claim 11, wherein in the first cooling, the heat-fragile component is cooled such that a peak temperature thereof lowers down to a temperature not higher than the first temperature.

13. The soldering method of claim 11, wherein in the heating, after a temperature of the first lead-free solder reaches a peak value thereof and before a temperature of the heat-fragile component exceeds the first temperature, the cooling starts cooling the heat-fragile component.

14. The soldering method of claim 13, wherein the substrate is transported from the heating to the second cooling while the first lead-free solder stays at a temperature lower than a solidus temperature thereof.

15. The soldering method of claim 11, wherein the first lead-free solder comprises flux component and solder powder, wherein the preheat means sets a temperature of the first lead-free solder not lower than a temperature at which the flux component activates and solvent of the flux component vapors, and a temperature of the heat-fragile component not higher than the first temperature.

16. The soldering method of claim 11, wherein in the preheating, the substrate is preheated from a face to which the first lead-free solder is applied.

17. The soldering method of claim 11, wherein in the preheating, the substrate is cooled from a face to which the heat-fragile component is mounted.

18. The soldering method of claim 11, wherein in the heating, the substrate is cooled from a face to which the heat-fragile component is mounted.

19. The soldering method of claim 11, wherein in the heating, the substrate is heated from a face to which the first lead-free solder is applied.

20. The soldering method of claim 19, wherein in the heating, the heating means includes a heating section which has a plurality of pipes facing the face to which the first lead-free solder is applied, and hot-wind heated by the heating section and spouting from the pipes heats the first lead-free solder.

21. The soldering method of claim 20, wherein the heating section of the heating means includes an air room provided to a root of the pipes and a shield plate disposed in the air room, wherein the shield plate has a hole at a place corresponding to a soldered place of the substrate, and the hot-wind blows out from the pipes coupled to the hole.

22. The soldering method of claim 21, wherein the pipes having a greater diameter are coupled to holes facing a place where the heat-fragile component having a greater heat capacity is soldered.

23. The soldering method of claim 21, wherein a number of the pipes having a smaller diameter are disposed toward a place where the heat-fragile component having a greater heat capacity is soldered.

24. The soldering method of claim 11, wherein in the first cooling, the substrate is cooled from a face to which the heat-fragile component is mounted.

25. The soldering method of claim 24, wherein the first cooling means includes a cooling section having a plurality of pipes facing the place to which the heat-fragile component is mounted, and cool-wind spouting from the pipes selectively cools the heat-fragile component.

26. The soldering method of claim 25, wherein the cooling section of the cooling means includes an air room provided to a root of the pipes and a shield plate disposed in the air room, wherein the shield plate has a hole corresponding to the place where the heat-fragile component is mounted, and the cool-wind blows out from the pipes coupled to the hole.

27. The soldering method of claim 26, wherein one pipe having a greater diameter among the pipes is disposed at a place facing the place where the heat-fragile component having a greater heat capacity is mounted.

28. The soldering method of claim 26, wherein a number of the pipes having a smaller diameter are disposed toward the place where the heat-fragile component having a greater heat capacity is mounted.

29. The soldering method of claim 11, wherein the heat-fragile component comprises a body having a great heat capacity and a lead coupled to the body and having a substantially smaller diameter than the body.

* * * * *